United States Patent
Golofit et al.

(10) Patent No.: US 11,366,640 B2
(45) Date of Patent: Jun. 21, 2022

(54) RANDOM NUMBER GENERATOR WITH A BISTABLE AND RING OSCILLATORS

(71) Applicant: POLITECHNIKA WARSZAWSKA, Warsaw (PL)

(72) Inventors: Krzysztof Golofit, Warsaw (PL); Piotr Wieczorek, Warsaw (PL)

(73) Assignee: POLITECHNIKA WARSZAWSKA, Warsaw (PL)

( * ) Notice: Subject to any disclaimer, the term of this patent is extended or adjusted under 35 U.S.C. 154(b) by 0 days.

(21) Appl. No.: 16/637,351

(22) PCT Filed: Aug. 7, 2018

(86) PCT No.: PCT/IB2018/055937
§ 371 (c)(1),
(2) Date: Feb. 7, 2020

(87) PCT Pub. No.: WO2019/030667
PCT Pub. Date: Feb. 14, 2019

(65) Prior Publication Data
US 2021/0365242 A1     Nov. 25, 2021

(30) Foreign Application Priority Data

Aug. 8, 2017 (PL) .................................... PL422484
Aug. 8, 2017 (PL) .................................... PL422485
(Continued)

(51) Int. Cl.
*G06F 7/58* (2006.01)
*H03K 3/84* (2006.01)

(52) U.S. Cl.
CPC ............... *G06F 7/588* (2013.01); *H03K 3/84* (2013.01)

(58) Field of Classification Search
CPC .................................. G06F 7/588; H03K 3/84
See application file for complete search history.

(56) References Cited

U.S. PATENT DOCUMENTS 5,007,087 A     4/1991    Bernstein et al.
5,153,532 A    10/1992    Albers et al.
(Continued)

FOREIGN PATENT DOCUMENTS

| CN | 105954596 A | 9/2016 |
|---|---|---|
| DE | 19618098 C1 | 6/1997 |
| WO | 0161854 A1 | 8/2001 |

OTHER PUBLICATIONS

Wieczorek, P. "Secure TRNG with random phase stimulation", Computer Science, Engineering. (2017).

*Primary Examiner* — Michael D. Yaary
(74) *Attorney, Agent, or Firm* — Browdy and Neimark, PLLC

(57) ABSTRACT

Random number generator (GL) comprising adjustable speed ring oscillators (GPRS, GPRS'), which have outputs (o-GPRS, o-GPRS') connected to inputs (i1-UM, i2-UM) of a metastability circuit (UM) and inputs (i1-DF, i2-DF) of a phase detector (DF), which outputs (o-UM, o-DF) are connected to inputs (r-US', i-US') of a control circuit (US'), having output (o-US') connected to control inputs (s-GPRS, s-GPRS') of the adjustable speed ring oscillators (GPRS, GPRS'). The outputs (o-UM, o-DF) of the metastability circuit (UM) and the phase detector (DF) are being outputs (o-GL, o2-GL) of the random number generator (GL).

18 Claims, 13 Drawing Sheets

(30) Foreign Application Priority Data

Figure 1:
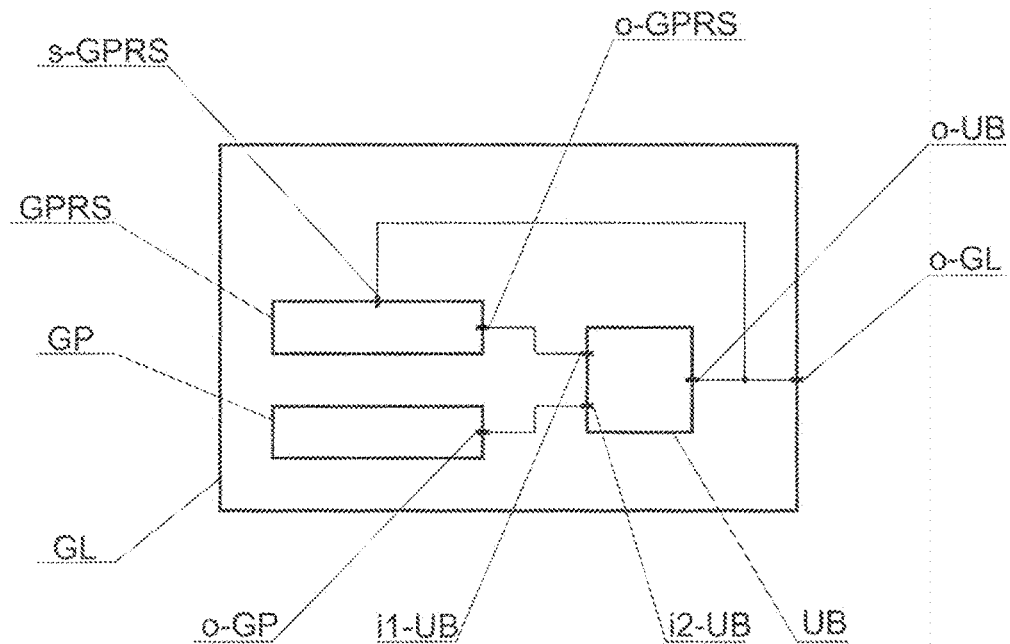

| Aug. 8, 2017 | (PL) | PL422488 |
| Aug. 8, 2017 | (PL) | PL422489 |
| Aug. 8, 2017 | (PL) | PL422490 |
| Aug. 8, 2017 | (PL) | PL422491 |
| May 17, 2018 | (PL) | PL425580 |
| May 17, 2018 | (PL) | PL425582 |
| May 17, 2018 | (PL) | PL425583 |
| May 17, 2018 | (PL) | PL425584 |
| May 17, 2018 | (PL) | PL425587 |
| May 17, 2018 | (PL) | PL425588 |
| May 17, 2018 | (PL) | PL425589 |
| Aug. 7, 2018 | (PL) | PL426575 |
| Aug. 7, 2018 | (PL) | PL426576 |

(56) References Cited

U.S. PATENT DOCUMENTS

| 2002/0156819 | A1 | 10/2002 | Oerlemans et al. | |
| 2004/0017235 | A1* | 1/2004 | Hars | H03K 3/84 |
| | | | | 327/164 |
| 2004/0264233 | A1 | 12/2004 | Fukushima et al. | |
| 2006/0069706 | A1 | 3/2006 | Lazich et al. | |
| 2009/0077147 | A1 | 3/2009 | Hars | |
| 2009/0222502 | A1* | 9/2009 | Ikegami | G06F 7/588 |
| | | | | 708/251 |
| 2011/0169580 | A1 | 7/2011 | Dodrill | |
| 2014/0101217 | A1 | 4/2014 | Barakat et al. | |
| 2014/0191813 | A1* | 7/2014 | Sul | H03K 3/0315 |
| | | | | 331/46 |
| 2014/0351305 | A1* | 11/2014 | Hamilton | G06F 7/588 |
| | | | | 708/251 |
| 2015/0178048 | A1* | 6/2015 | Burleson | G06F 7/588 |
| | | | | 708/255 |
| 2017/0126218 | A1 | 5/2017 | Ankenapalli et al. | |

* cited by examiner

RANDOM NUMBER GENERATOR WITH A BISTABLE AND RING OSCILLATORS

The invention concerns a random number generator intended especially for generating truly random numbers and series.

There are known in the art designs of random number generators, which use pairs of ring oscillators and bistables, such as a phase detector or a metastability circuit.

In the state of the art, from the article by Piotr Z. Wieczorek, "Secure TRNG with Random Phase Stimulation", XL-th IEEE-SPIE Joint Symposium on Photonics, Web Engineering, Electronics for Astronomy and High Energy Physics Experiments, Wilga 2017, SPIE volume 10445, ISBN: 9781510613546, Electronic ISBN: 9781510613553, there is known a random number generator, which comprises two ring oscillators and a metastability circuit. Outputs of the ring oscillators are connected to inputs of the metastability circuit, whereas an output of the metastability circuit is an output of the random number generator. A ring oscillator comprise a delay line closed in a loop, where an input and an output are connected with each other and connected to an output of the ring oscillator. The delay line comprise delays connected in series and connected between the input and the output of the delay line. The disadvantage of such a random number generator is its low speed resulting from rare occurrences of events that are able to initiate a metastable work of the metastability circuit, which results from slow-moving random walk in phase.

From the publication of the German patent application DE19618098 and from the publication of the US patent application US2011169580, there are known in the art random number generators, in which outputs of two ring oscillators are connected to inputs of a phase detector, whereas an output of the phase detector is an output of the random number generator. The disadvantage of such random number generators is the low randomness and low speed of operation of such systems resulting from slow-moving random walk in phase.

There are known in the art, e.g. from the US patent applications of inventions U.S. Pat. No. 5,153,532, US2002156819 and US2006069706, random number generators, in which an addition—using a XOR gate—of output signals of two or many ring oscillators was applied.

There is known in the art, e.g. from the US patent application of invention U.S. Pat. No. 5,007,087, a design of a random number generator based on an analog chaotic circuit with continuous variables. The disadvantage of such generators is that they cannot be implemented in digital programmable circuits, and therefore it is difficult to use modern technological lines for their production.

There is known in the art, e.g. from the US patent application of invention US2014101217, a design of a random number generator based on a digital chaotic, in which the feedback provides discrete values. The disadvantage of such generators is that they have a finite number of system states.

There is known in the art, e.g. from the US patent application of invention US2004264233, a switchable chain ring oscillator, which comprises two delay lines connected with each other so, that an output of the first line is connected to an input of the second line, which input and output are connected to a controlled switch, having an output connected to an input of the first line. The delay lines comprise delays connected in series.

There is known in the art, e.g. from the Chinese patent application of invention CN105954596, an adjustable speed ring oscillator, which comprises delay line, which input and output are connected to each other and which comprises delays connected in series. In the delay line, where an output of one delay is connected to an input of another delay, there are connected capacitors through controlled switches, which allows to change the operating frequency of the ring oscillator.

There is known in the art, e.g. from the US patent application of invention US2017126218, a controlled delay circuit, comprising a series of transmission gates connected between an inverter and the ground of the inverter, which allows to regulate the current during switching of the inverter, and thus the speed of the inverter.

The aim of the invention is to provide a nondeterministic initialization of multiple metastability processes, to induce a phase correction process, to induce a chaotic behavior, to obtain a random disturbance in the phase correction process and to obtain a random stream that simultaneously allows to monitor the phase correction circuit.

In random number generator comprising a bistable, having an output connected to an output of the random number generator, and comprising at least two ring oscillators, being respectively connected to inputs of the bistable, according to the invention at least one of the ring oscillators is an adjustable speed ring oscillator. Further the output of at least one of the bistables, having the inputs connected to the ring oscillators, is connected to at least one of control inputs of the adjustable speed ring oscillator. The effect of such a construction is that instead of the regular random number generator also a chaotic behavior is obtained. Moreover, the variable in the feedback of the chaotic circuit is not only a logical value but also the time, resulting in properties specific to analog chaotic systems, although it is digitally implemented. For that reason it can be produced in modern digital technological lines, without giving up the beneficial properties of analog circuits.

Advantageously it has at least a second bistable, having a first input connected to one of the ring oscillators and a second input connected to another of the ring oscillators. Such a construction provides a second data stream.

Advantageously it comprises at least a third ring oscillator, wherein at least the second bistable has at least one of the inputs connected to at least the third ring oscillator. Such a construction makes the data stream from the second bistable orthogonal in relation to the first bistable.

Advantageously at least one output of at least one of the bistables is connected to at least one control input of the adjustable speed ring oscillators through a control circuit. The use of the control circuit allows to make changes of a feedback signal and in result improvement of the chaotic circuit performance.

Advantageously at least one output of at least one of the bistables is connected to at least one control input of the adjustable speed ring oscillators through a control circuit. Further an output of another bistable is connected to a second input of the control circuit. Such a construction allows for a random disturbance of the feedback.

Advantageously at least one of the bistables is a phase detector. Phase detector provides a precise detection of the edge priority of input waveforms, which is used for phase correction.

Advantageously at least one of the bistables is a metastability circuit. Such a solution provides a random response of the circuit in the case of proximity of the edges of the input waveforms. More specifically, for phase shifts that do not fit in the metastability window, the metastability circuit provides a phase detection and is used to correct the phase of the ring oscillators connected to its inputs. However, for phase shifts located in the metastability window, the metastability circuit provides a random value on its output and consequently induces a random phase change, which differs the this circuit from the phase detector. Moreover, the metastability circuit causes an additional delay in the feedback loop, which extends the range of phase shifts in the ring oscillators connected to its inputs.

Advantageously at least one of the ring oscillators comprises at least one delay line, having an input and an output connected together and connected to the output of the ring oscillator. Further the delay line comprises delays connected in series.

Advantageously at least one of the adjustable speed ring oscillator comprises at least one delay line, having an input and an output connected together and connected to the output of the adjustable speed ring oscillator. Further the delay line comprises delays connected in series.

Advantageously at least one of the adjustable speed ring oscillators comprises at least one additional delay subcircuit, connected to the delay line, to an output of a delay, through a switch, having a control input connected to the control input of the adjustable speed ring oscillator. Such a solution allows to adjust the frequency of the adjustable speed ring oscillator, and thus to regulate the phase relative to another oscillator.

Advantageously at least one adjustable speed ring oscillator comprises at least one controlled delay subcircuit connected in series into the delay line between an output of one delay and an input of the next delay in chain. Further a control input of the controlled delay subcircuit is connected to the control input of the adjustable speed ring oscillator. Such a solution allows to adjust the frequency of the adjustable speed ring oscillator, and thus to regulate the phase relative to another oscillator.

Advantageously the controlled delay subcircuit comprises at least two field effect transistors of the opposite channel type, having drains and sources paired together, wherein one of the pairs is connected to an input of the controlled delay subcircuit, other pair is connected to an output of the controlled delay subcircuit, and a control input of the controlled delay subcircuit is connected to gates of both field effect transistors. Such a solution allows to differentiate the delays caused by the controlled delay subcircuit at a very low cost, since the transistors with the opposite channel type turn on at opposite logic states at their gates.

Advantageously in the field effect transistors the ratio of the length and width of the channel of one transistor is higher than the ratio of the length and width of the channel of the other transistor. This solution ensures the control of delays caused by the controlled delay subcircuit by defining the geometry of transistor channels.

Advantageously at least one delay is connected in series with at least one of the field effect transistors. This solution provides an additional delay time in the path of chosen transistor.

Advantageously at least one inverter is connected between the gates of the field effect transistors and the control input of the controlled delay subcircuit. Such a solution provides the opposite operation of transistors controlled by the same signal, resulting in the opposite frequency change in two complementary adjustable speed ring oscillator.

Advantageously at least one adjustable speed ring oscillator is a switchable chain ring oscillator. Such a solution allows to adjust the frequency of the adjustable speed ring oscillator, and thus to regulate the phase relative to another oscillator.

Advantageously at least one switchable chain ring oscillator comprises at least two delay lines connected with each other so that an output of the first delay line is connected to an input of the second delay line, and an output of one of the delay lines is connected to the output of the switchable chain ring oscillator, wherein delay lines comprise chains of delays.

Advantageously at least one switchable chain ring oscillator comprises a multiplexer, having a control input connected to the control input of the switchable chain ring oscillator. Further an output of the multiplexer is connected to the input of one of the delay lines. Further inputs of the multiplexer are respectively connected to an input and an output of the other delay line.

Advantageously the random number generator comprises at least two metastability circuits connected to the delay lines so, that the inputs of the metastability circuits are separated in the delay lines with at least one delay. Such a solution assures that the delays are driven by metastability circuits in the minimal manner.

Advantageously at least one of the metastability circuits is connected with the first input to a series of delays of the delay lines of one ring oscillator, after a delay having the first number in this series counting from a delay connected with its input to the output of the ring oscillator. Further the second input of the metastability circuit is connected to a series of delays of the delay lines of another ring oscillator, after a delay having the second number in this series counting from a delay connected with its input to the output of the another ring oscillator. Further the first number is different from the second number. Such a solution causes that the metastability circuit is triggered by the input signal with a different phase than the phase that is currently present in the ring oscillators.

Advantageously at least two metastability circuits are connected with at least one input each in the same place of at least one delay line. Having different metastability circuits connected in the same places causes that the metastability circuits are triggered with exactly the same signal.

Advantageously at least one control system comprises at least one delay. The delay in the feedback loop causes a wider range of phase shifts between ring oscillators.

Advantageously at least one control circuit comprises randomness adder, wherein the first input being an input of random data of the control circuit, second input being an signal input of the control circuit, and an output of the randomness adder being an output of the control circuit. Such a solution allows for a random disturbance in the feedback loop.

Advantageously the first input of the randomness adder is connected to the input of random data of the control circuit through a strobing circuit. Further a strobe control is connected to the strobing circuit.

Advantageously the second input of the randomness adder and its output are connected in series with at least one delay, wherein an input of the first delay in the series is connected to the signal input of the control circuit, and the output of the last delay in series is connected to the output of the control circuit.

Advantageously the first input of the randomness adder is connected to the input of random data of the control circuit through a strobing circuit, and in that a strobe control is connected to the strobing circuit. Further the second input of the randomness adder and its output are connected in series with at least one delay, wherein an input of the first delay in the series is connected to the signal input of the control circuit, and the output of the last delay in series is connected to the output of the control circuit.

Advantageously at least one phase detector consists of a flip-flop with two inputs being the inputs of the phase detector and an output being the output of the phase detector.

Advantageously at least one phase detector comprises two flip-flops each having two inputs and two outputs, wherein the inputs of the flip-flops are connected to inputs of the phase detector, and outputs of the flip-flops are connected to outputs of the phase detector. Further the first input of the phase detector is connected to both the first input of the first flip-flop and the second input of the second flip-flop. Further the second input of the phase detector is connected to both the second input of the first flip-flop and the first input of the second flip-flop. Further the output of the phase detector is connected to chosen outputs of the flip-flops through a logic circuit.

Advantageously at least one metastability circuit consists of a flip-flop with two inputs being the inputs of the metastability circuit and an output being the output of the metastability circuit.

Advantageously at least one metastability circuit comprises a metastable circuit with an oscillatory response with two inputs being the inputs of the metastability circuit and an output being the output of the metastability circuit.

Advantageously the output of the metastable circuit with an oscillatory response is connected to the output of the metastability circuit through an adder.

Advantageously the metastability circuit comprises counter, having outputs connected to consecutive inputs of the adder, and having an input connected to the output of the metastable circuit with an oscillatory response.

Advantageously at least one metastability circuit comprises a metastable generator of time intervals, having inputs connected to the inputs of the metastability circuit and outputs connected to inputs of an arbiter circuit, having outputs connected to the outputs of the metastability circuit through a logic circuit.

Advantageously the metastable generator of time intervals comprises two flip-flops having two inputs and single outputs, wherein the inputs of the flip-flops of the metastable generator of time intervals are connected to the inputs of the metastability circuit and wherein, the first input of the metastability circuit is connected to both the first input of the first flip-flop and the first input of the second flip-flop, the second input of the metastability circuit is connected to both the second input of the first flip-flop and the second input of the second flip-flop. Further the arbiter circuit comprises two flip-flops having two inputs and two outputs each, wherein the outputs of the flip-flops of the metastable generator of time intervals are connected to the inputs of the flip-flops of the arbiter circuit and wherein, the output of the first flip-flop of the metastable generator of time intervals is connected to both the first input of the first flip-flop of the arbiter circuit and the second input of the second flip-flop of the arbiter circuit, the output of the second flip-flop of the metastable generator of time intervals is connected to both the second input of the first flip-flop of the arbiter circuit and the first input of the second flip-flop of the arbiter circuit. Further the logic circuit consists of a conjunction gate, through which selected outputs of the flip-flops of the arbiter circuit are connected to the outputs of the metastability circuit.

The invention allows the simultaneous generation of many independent sequences of random numbers due to the instability of the solution of many metastability processes, as well as enables the control of the phase correction process and the chaotic process.

The invention has been described below in detail, with reference to the attached figures.

Figure 2:
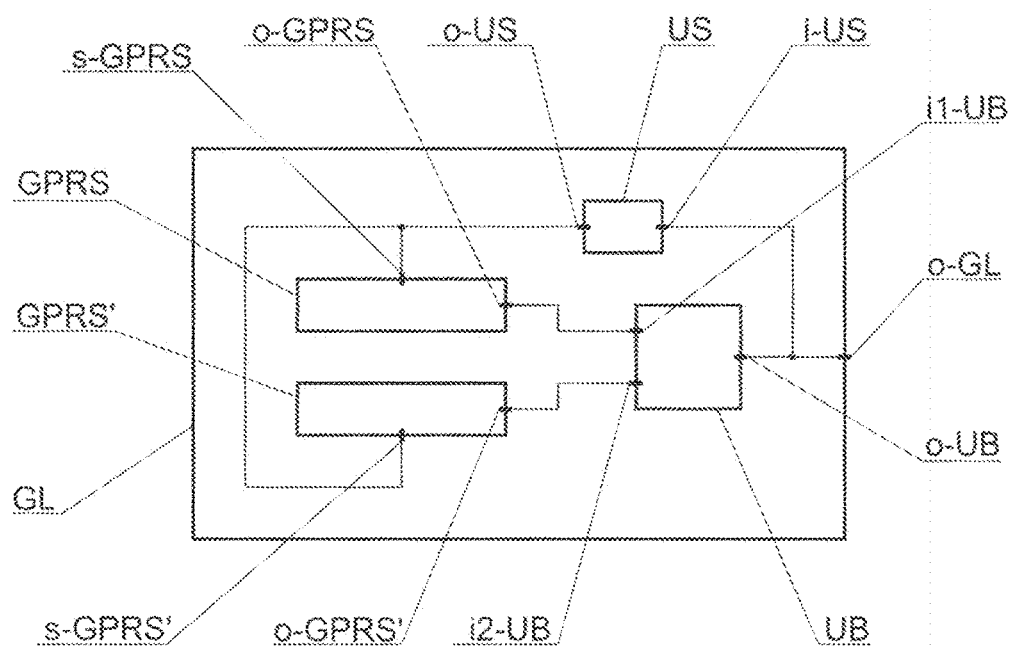
Figure 3:
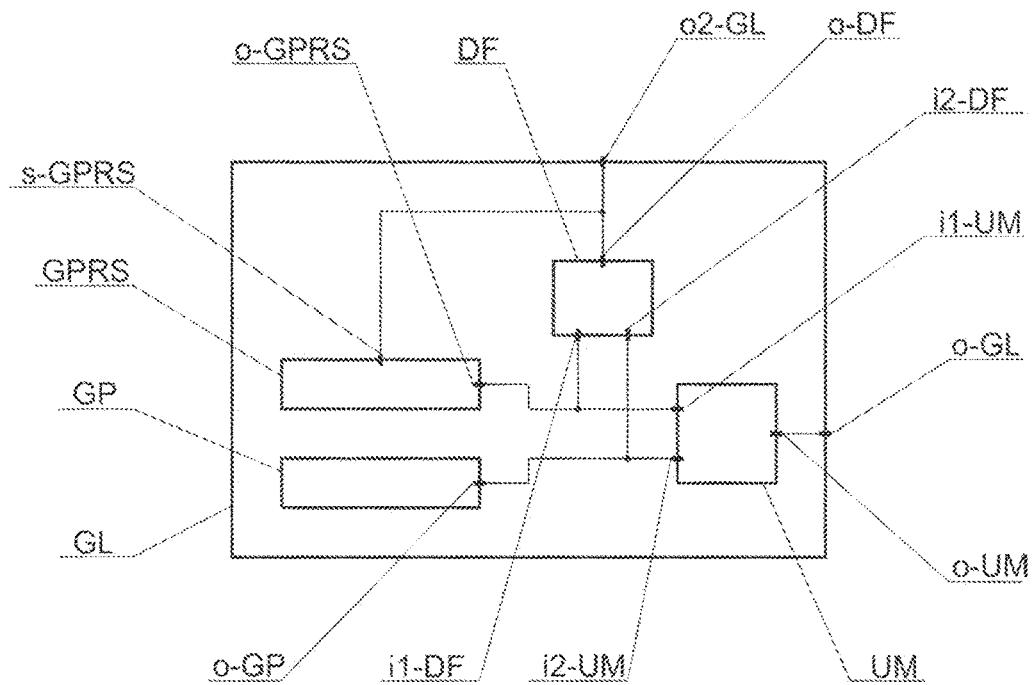
Figure 4:
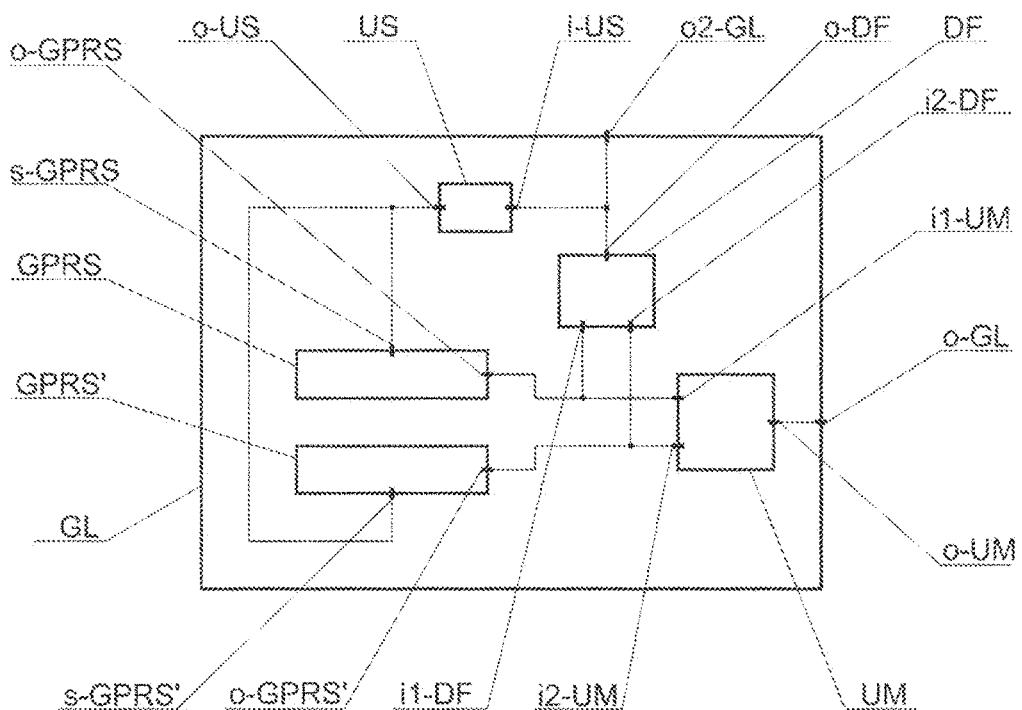
Figure 5:
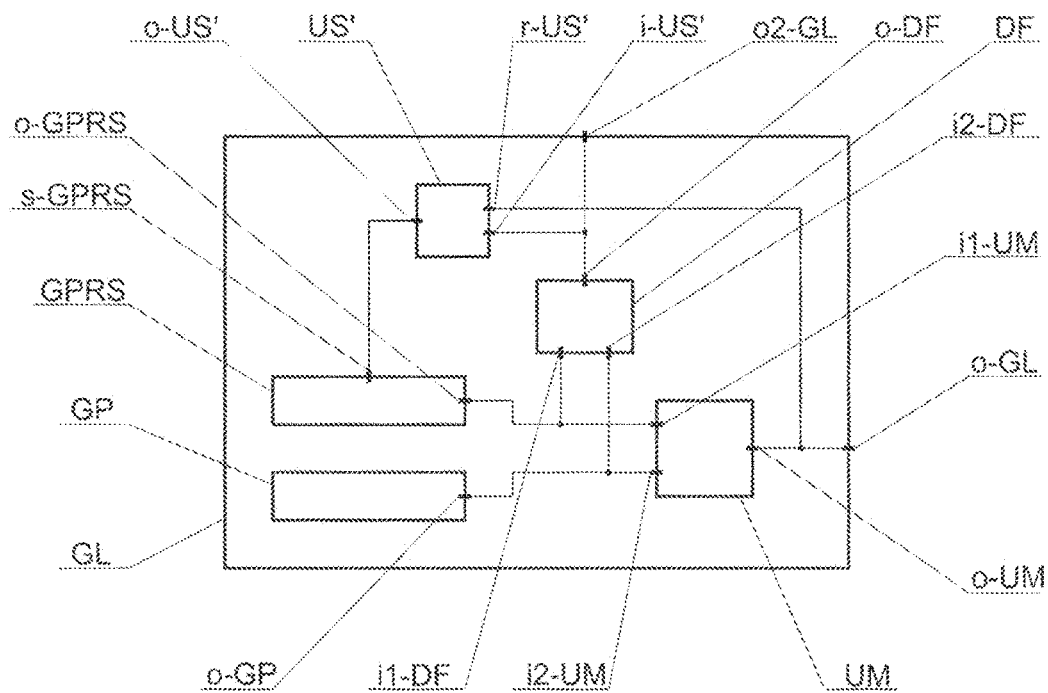
Figure 6:
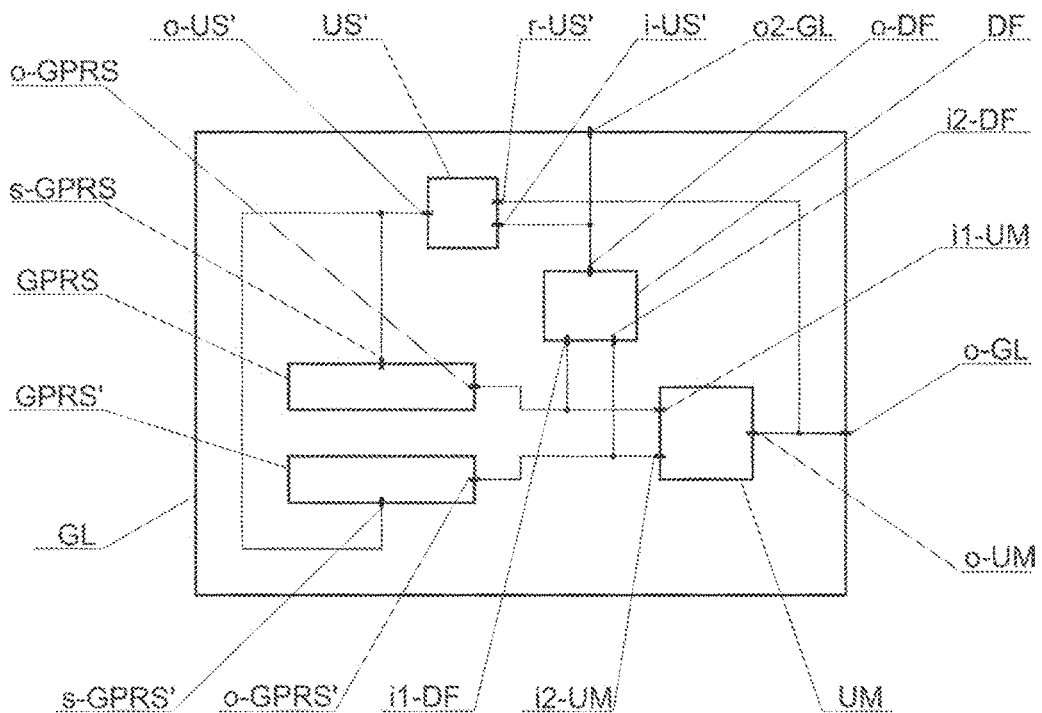
Figure 7:
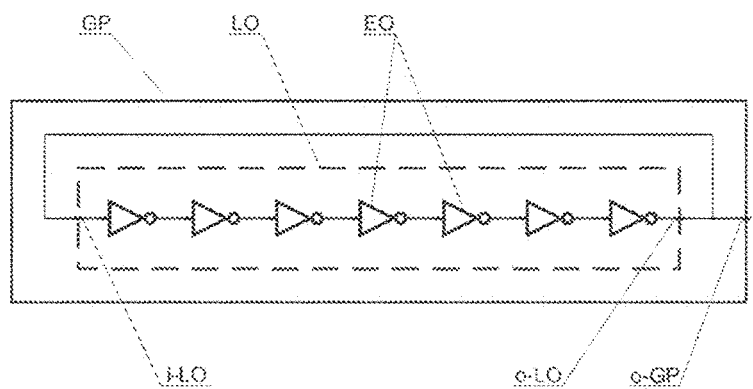
Figure 8:
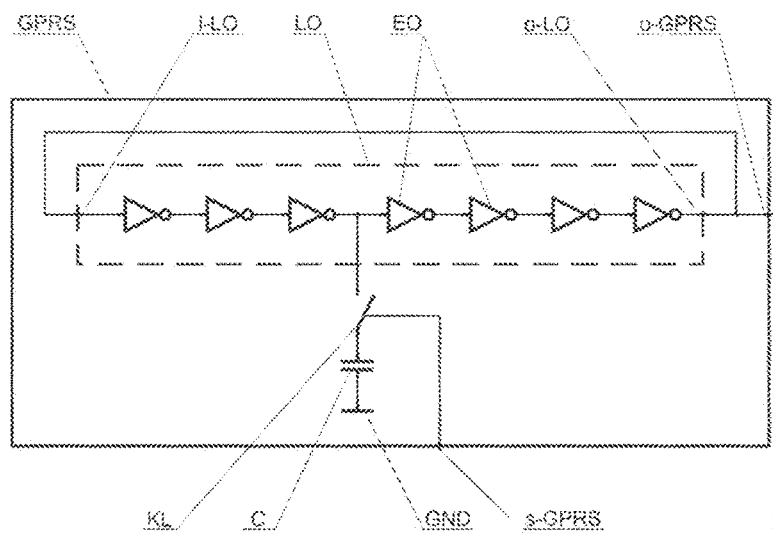
Figure 9:
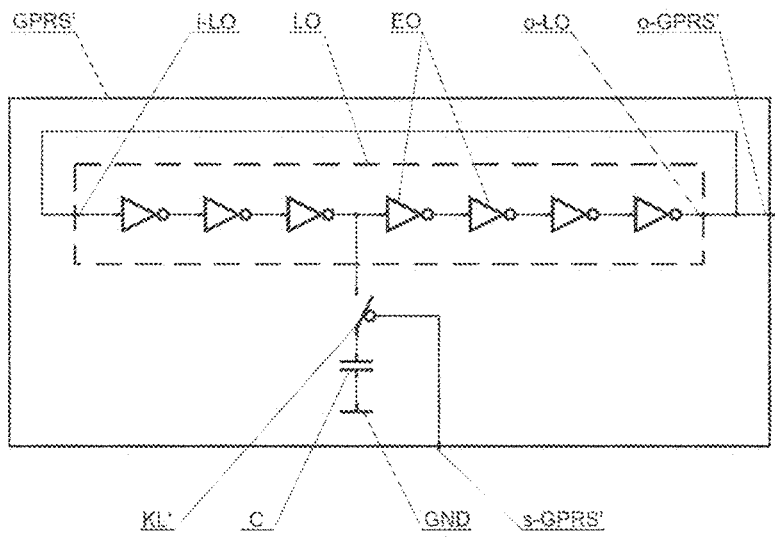
Figure 10:
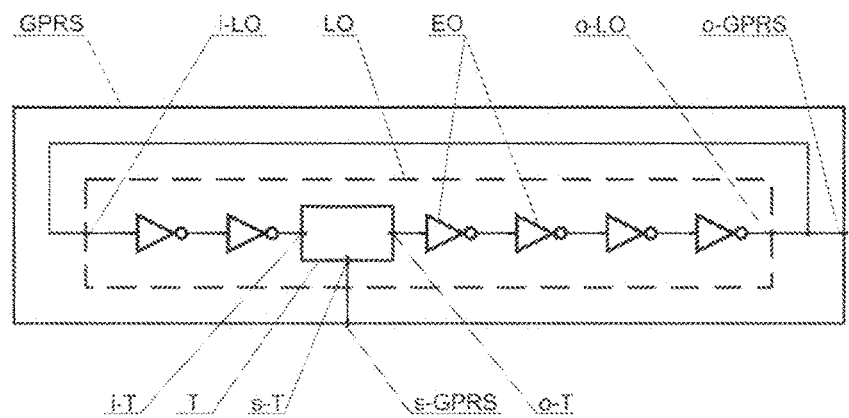
Figures 11, 13:
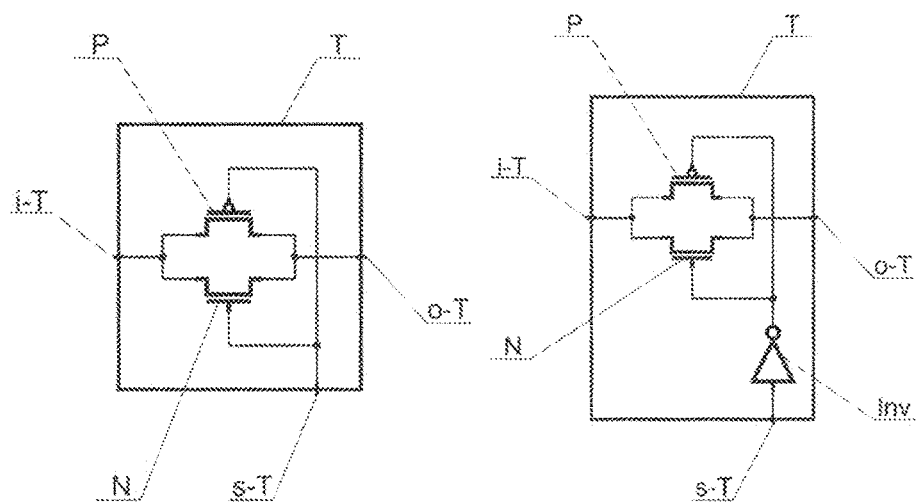
Figure 12:
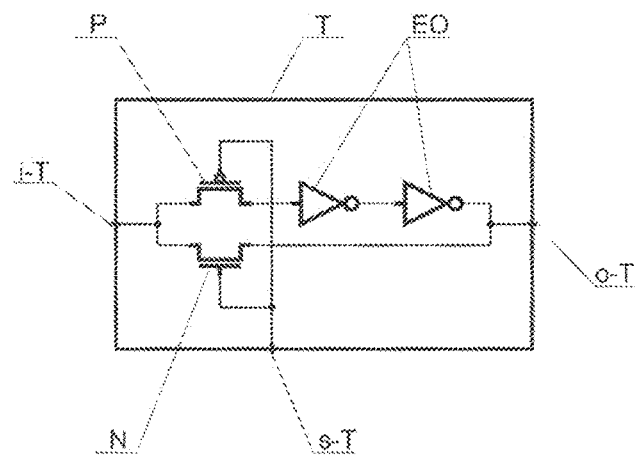
Figure 14:
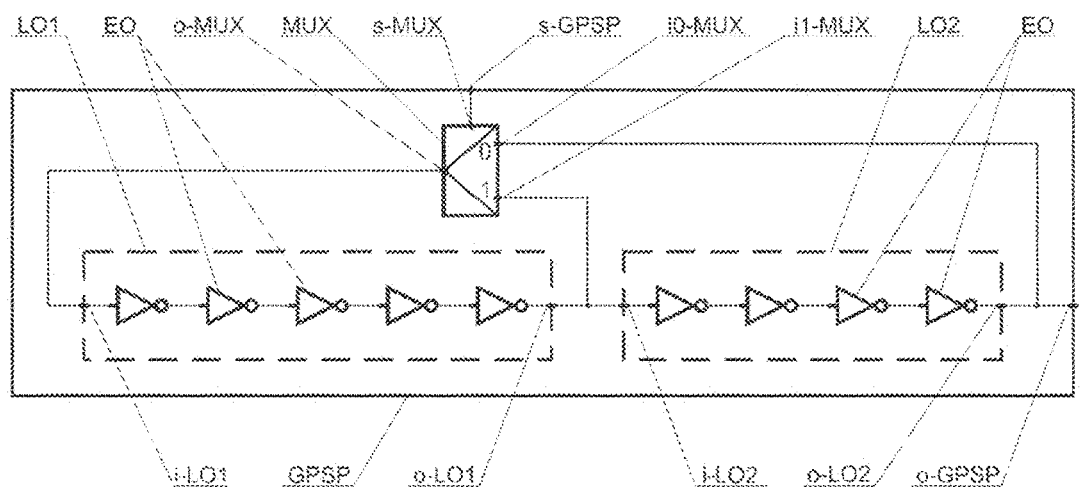
Figure 15:
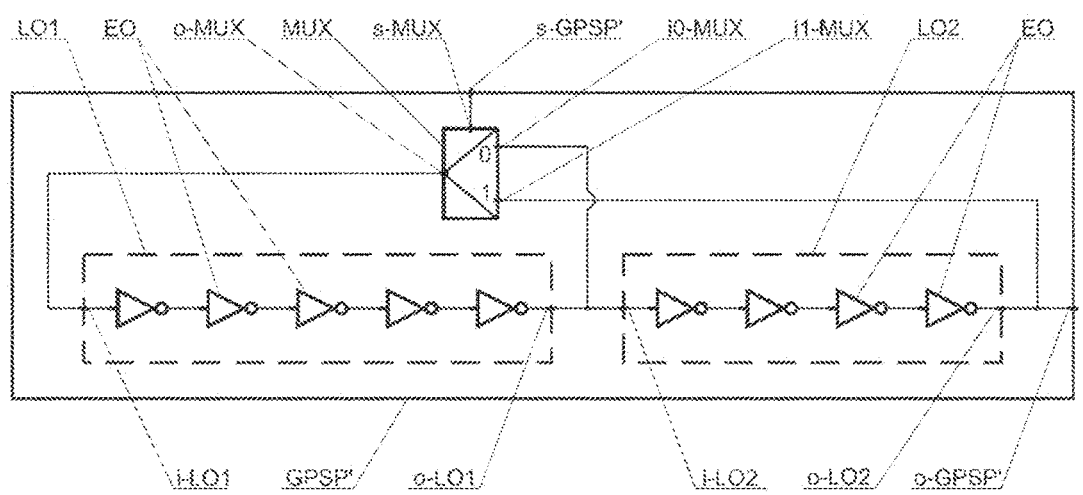
Figure 16:
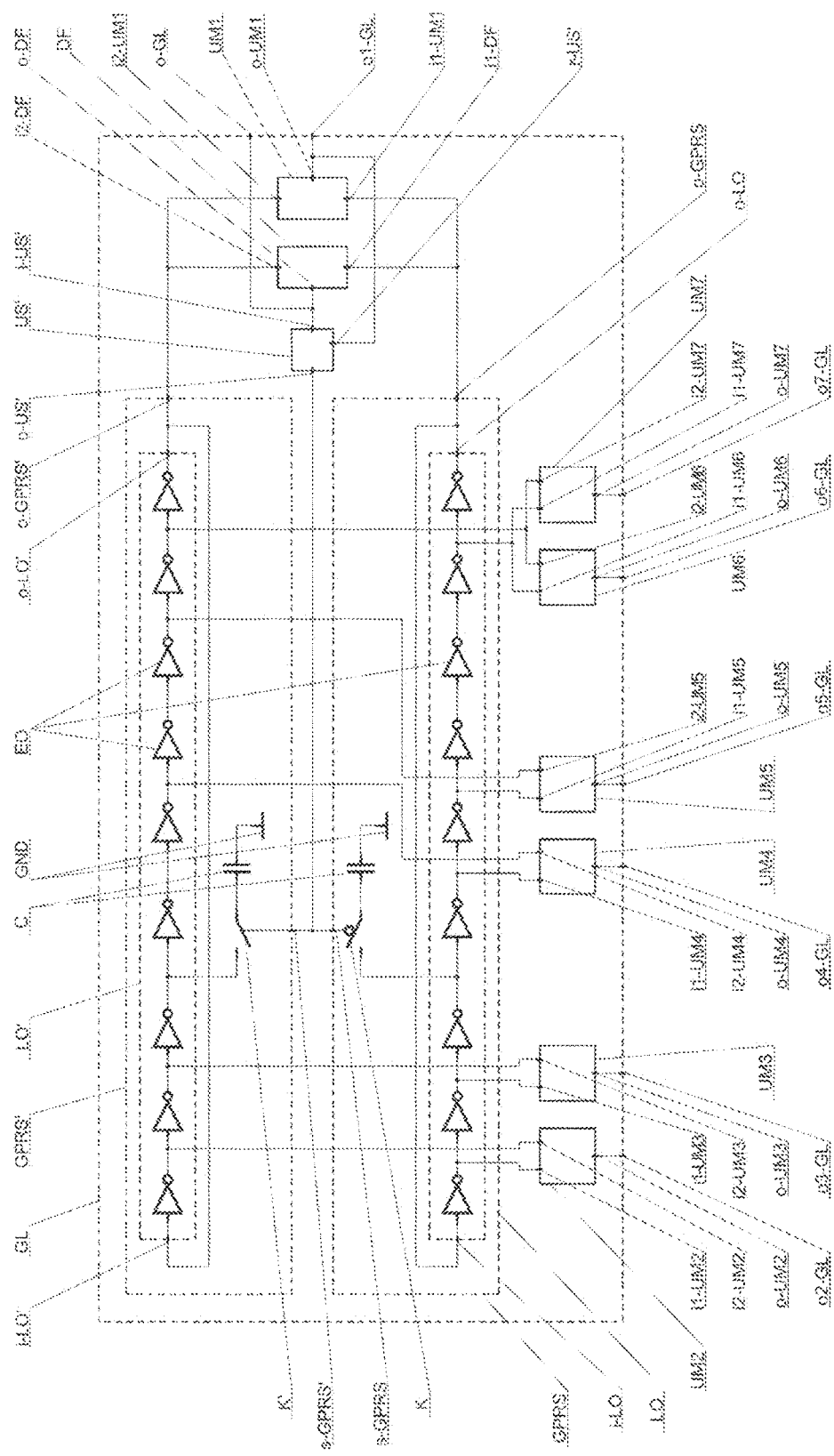
Figure 17:
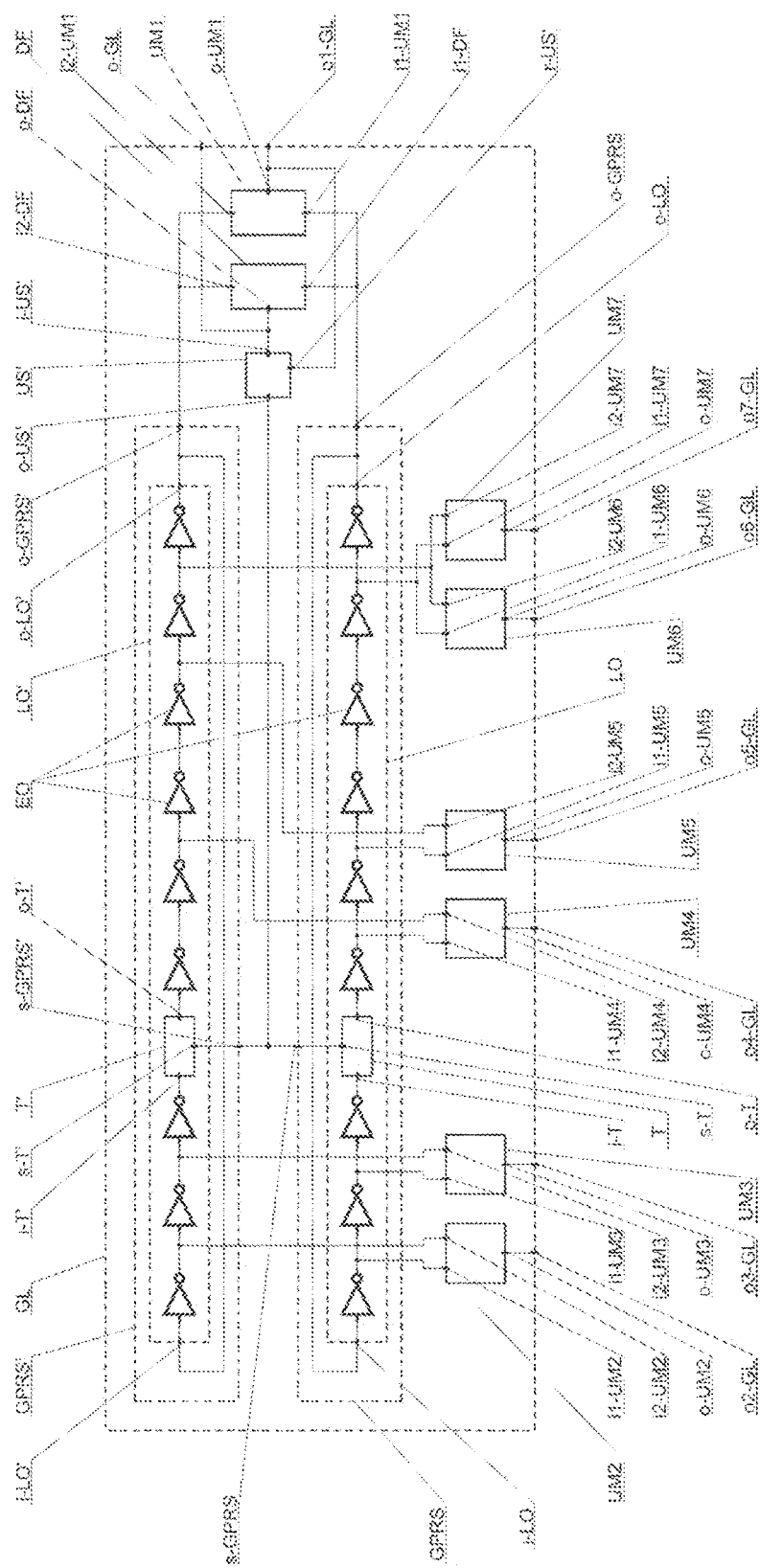
Figure 18:
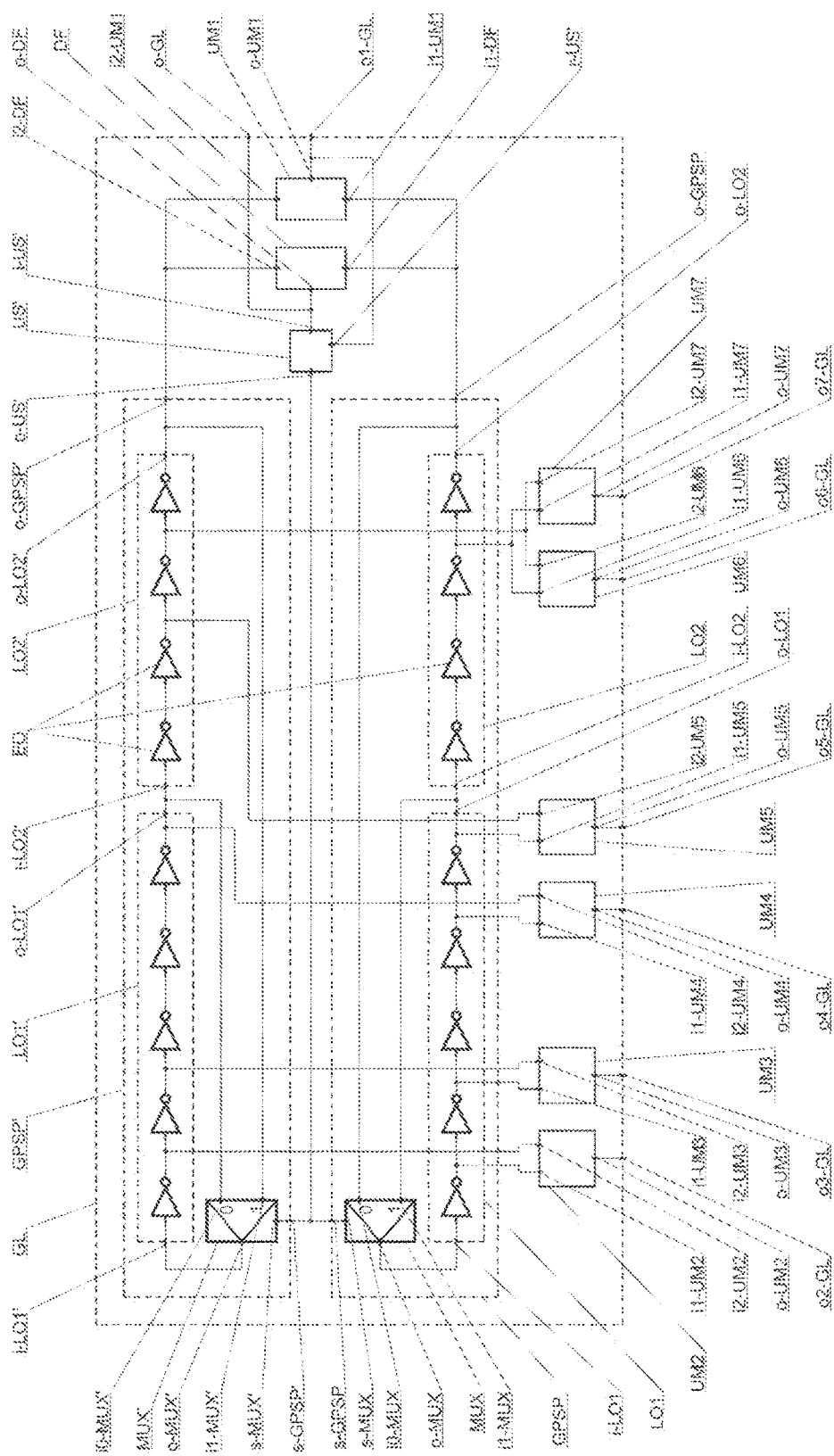
Figure 19:
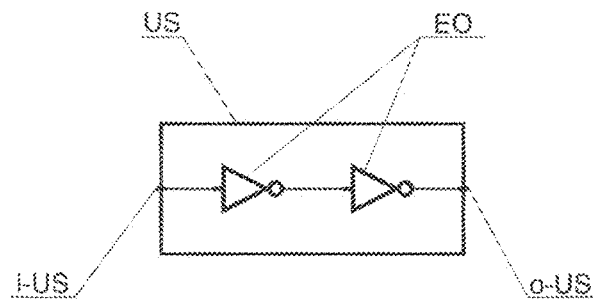
Figure 20:
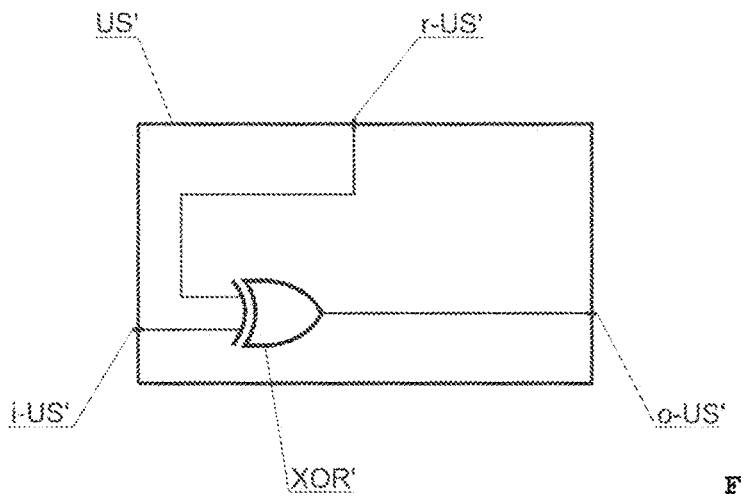
Figure 21:
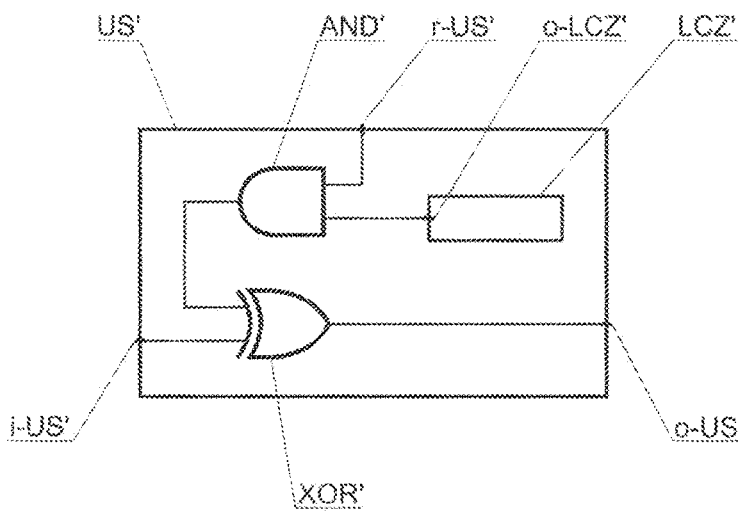
Figure 22:
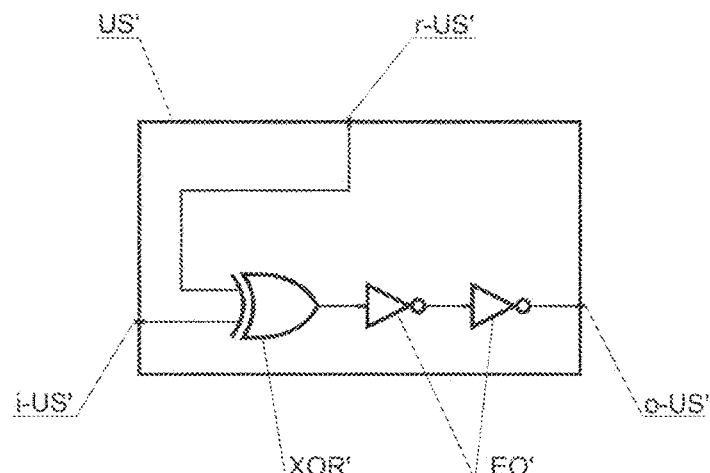
Figure 23:
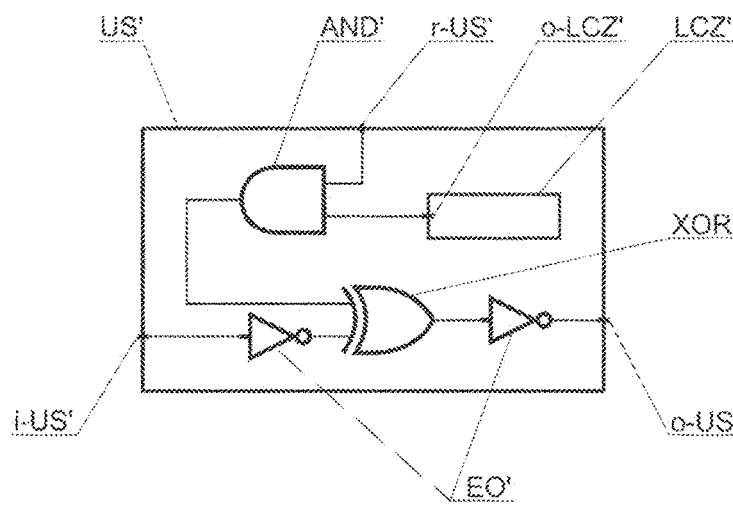
Figure 24:
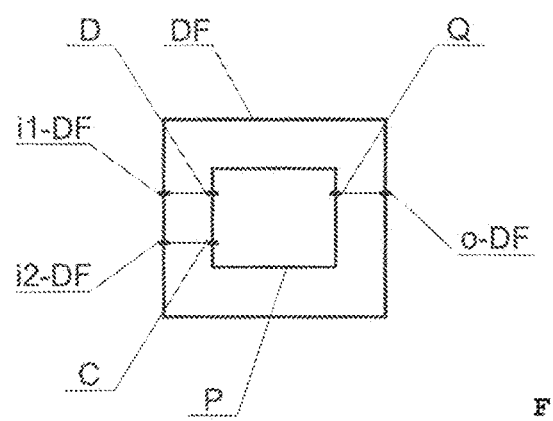
Figure 25:
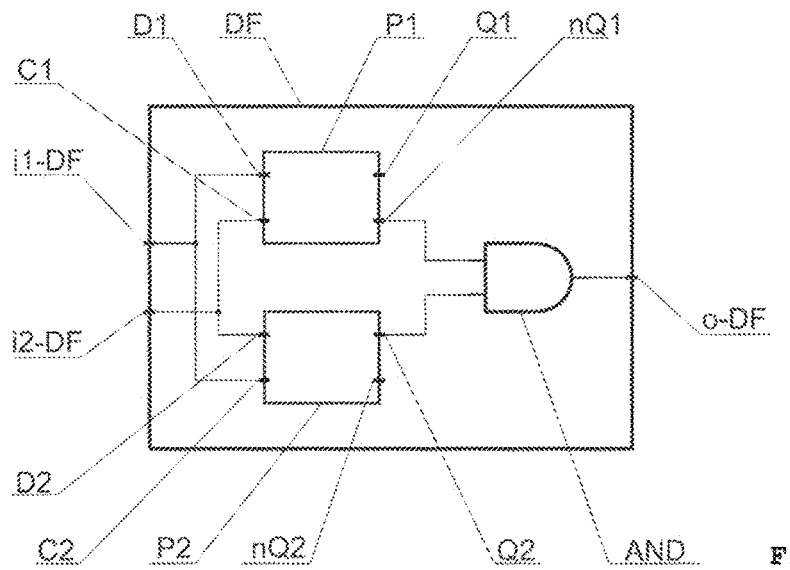
Figure 26:
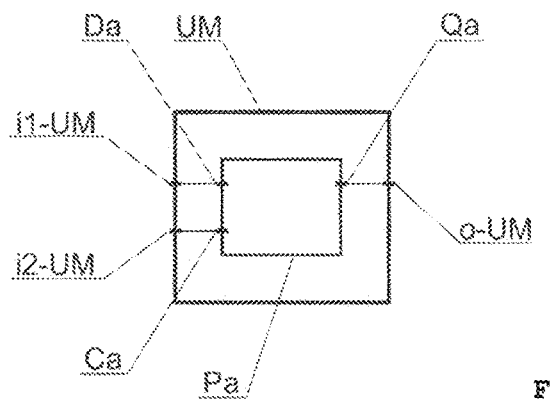
Figure 27:
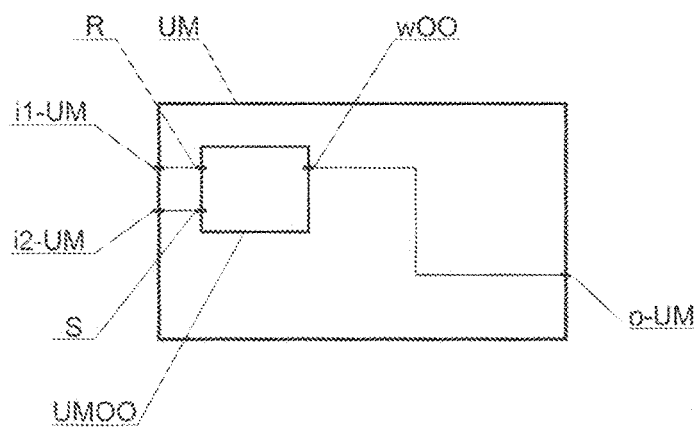
Figure 28:
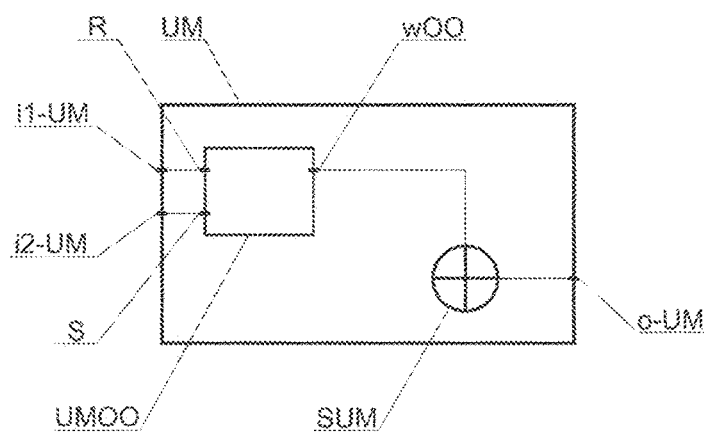
Figure 29:
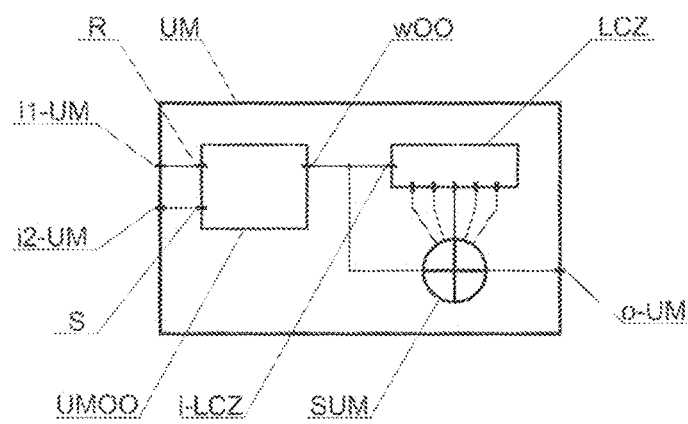
Figure 30:
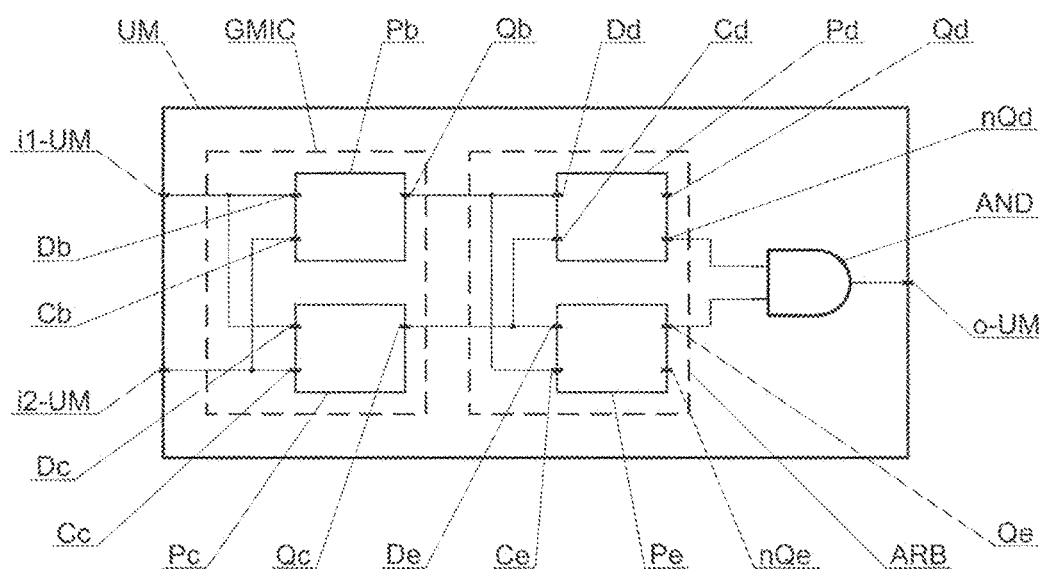

FIG. 1 presents a block diagram of random number generator with ring oscillator, adjustable speed ring oscillator and bistable, FIG. 2 presents a block diagram of random number generator with two adjustable speed ring oscillators and bistable, FIG. 3 presents a block diagram of random number generator with ring oscillator and adjustable speed ring oscillator, metastability circuit and phase detector, FIG. 4 presents a block diagram of random number generator with two adjustable speed ring oscillators, metastability circuit, phase detector and control circuit having single input, FIG. 5 presents a block diagram of random number generator with ring oscillator and adjustable speed ring oscillator, metastability circuit, phase detector and control circuit having two inputs, FIG. 6 presents a block diagram of random number generator with two adjustable speed ring oscillators, metastability circuit, phase detector and control circuit having two inputs, FIG. 7 presents a block diagram of ring oscillator, FIG. 8 presents a block diagram of first adjustable speed ring oscillator, FIG. 9 presents a block diagram of second adjustable speed ring oscillator, FIG. 10 presents a block diagram of third adjustable speed ring oscillator, FIG. 11 presents a block diagram of controlled delay subcircuit having two field effect transistors, FIG. 12 presents a block diagram of controlled delay subcircuit having two field effect transistors and additional delays connected in series with one of the field effect transistors, FIG. 13 presents a block diagram of controlled delay subcircuit with inversion of the control signal, FIG. 14 presents a block diagram of first switchable chain ring oscillator, FIG. 15 presents a block diagram of second switchable chain ring oscillator, FIG. 16 presents first detailed block diagram of random number generator based on two adjustable speed ring oscillators with a series of metastability circuits, FIG. 17 presents second detailed block diagram of random number generator based on two adjustable speed ring oscillators with a series of metastability circuits, FIG. 18 presents detailed block diagram of random number generator based on two switchable chain ring oscillators with a series of metastability circuits, FIG. 19 presents a block diagram of control circuit comprising delays, FIG. 20 presents a block diagram of control circuit comprising randomness adder, FIG. 21 presents a block diagram of control circuit comprising randomness adder and strobing circuit, FIG. 22 presents a block diagram of control circuit comprising randomness adder and delays, FIG. 23 presents a block diagram of control circuit comprising randomness adder, strobing circuit and delays, FIG. 24 presents a block diagram of phase detector that consists of one flip-flop, FIG. 25 presents a block diagram of phase detector comprising two flip-flops, FIG. 26 presents a block diagram of metastability circuit that consists of flip-flop, FIG. 27 presents a block diagram of metastability circuit comprising metastable circuit with an oscillatory response, FIG. 28 presents a block diagram of metastability circuit comprising metastable circuit with an oscillatory response and adder, FIG. 29 presents a block diagram of metastability circuit comprising metastable circuit with an oscillatory response, adder and counter, and FIG. 30 presents a block diagram of metastability circuit comprising metastable generator of time intervals and arbiter circuit.

Random number generator presented in FIG. 1 comprises a ring oscillator GP and an adjustable speed ring oscillator GPRS, which outputs o-GP and o-GPRS are connected to inputs i1-UB and i2-UB of a bistable UB. An output of the bistable o-UB is connected to a control input of the adjustable speed ring oscillator s-GPRS and to an output o-GL of the random number generator GL.

The bistable UB changes a frequency of the adjustable speed ring oscillator GPRS by iterative changes or synchronization of the phase of both oscillators GP and GPRS. Such a feedback allows the circuit comprising the ring oscillators GP and GPRS and the bistable UB to manifest a chaotic behavior. Moreover, if the bistable is slow enough, the detection process manifests much often a metastable behavior, which improves the quality of randomness of the entire system.

Random number generator presented in FIG. 2 comprises two adjustable speed ring oscillators GPRS and GPRS', which outputs o-GPRS and o-GPRS' are connected to inputs i1-UB and i2-UB of a bistable UB. An output of the bistable o-UB is connected to an input i-US of a control circuit US, and an output of the control circuit o-US is connected to control inputs of the adjustable speed ring oscillators s-GPRS and s-GPRS'. The output o-UB of the bistable UB is also connected to an output o-GL of the random number generator GL.

The delay added by the control circuit US to the feedback, used for the phase control of the oscillators, causes that the circuit made of the adjustable speed ring oscillators GPRS and GPRS', the bistable UB and the control circuit US is a chaotic circuit. Moreover, the proximity of the oscillators phases means the time closeness of the edges of generated signals, which change their temporal position by the occurrence of the jitter phenomenon in digital circuits. For that reason, the pseudo-random chaotic circuit becomes a non-deterministic circuit—the more random, the slower the bistable is. The use of the second adjustable speed ring oscillator, operating in the opposite way to the first adjustable speed ring oscillator, improves the chaotic performance of the circuit.

Random number generator presented in FIG. 3 comprises a ring oscillator GP and an adjustable speed ring oscillator GPRS, which outputs o-GP and o-GPRS are connected to inputs i1-DF and i2-DF of a phase detector DF and to inputs i1-UM and i2-UM of a metastability circuit UM. An output of the phase detector o-DF is connected to a control input of the adjustable speed ring oscillator s-GPRS. An output o-UM of the metastability circuit UM is connected to first output o-GL of the random number generator GL. Second output o2-GL of the random number generator GL is connected to the output o-DF of the phase detector DF.

The phase detector DF changes a frequency of the adjustable speed ring oscillator GPRS by iterative changes or synchronization of the phase of both oscillators GP and GPRS. The proximity of the oscillators' phases means time closeness of the edges of generated signals, which are used to stimulate the metastability circuit UM, which produces a random phenomenon.

Both outputs of the generator allow to obtain two independent orthogonal binary random streams. Random variables on both outputs o-GL and o2-GL of the random number generator GL are independent, because they are obtained in two different circuit processes—one in the phase correction system, the other in the metastability circuit. The second output o2-GL also provides the ability to control the phase correction process, as well as the ability to control the conditions, quality and parameters of the metastability process initialization through the phase correction system.

Random number generator presented in FIG. 4 comprises two adjustable speed ring oscillators GPRS and GPRS', which outputs o-GPRS and o-GPRS' are connected to inputs i1-DF and i2-DF of a phase detector DF and to inputs i1-UM and i2-UM of a metastability circuit UM. An output of the phase detector o-DF is connected to an input i-US of a control circuit US, and an output of the control circuit o-US is connected to control inputs of the adjustable speed ring oscillators s-GPRS and s-GPRS'. An output o-UM of the metastability circuit UM is connected to first output o-GL of the random number generator GL. Second output o2-GL of the random number generator GL is connected to the output o-DF of the phase detector DF.

The delay caused by the control circuit US in the generator phase control feedback increases the range of phase shifts. The use of the second adjustable speed ring oscillator GPRS', operating in the opposite way to the first adjustable speed ring oscillator GPRS, improves generator phase convergence.

The random number generator presented in FIG. 5 comprises a ring oscillator GP and an adjustable speed ring oscillator GPRS, which outputs o-GP and o-GPRS are connected to inputs i1-DF and i2-DF of a phase detector DF and to inputs i1-UM and i2-UM of a metastability circuit UM. An output of the phase detector o-DF is connected to a main input i-US' of a control circuit US', an output of the metastability circuit o-UM is connected to an additional input of the control circuit r-US', and an output of the control circuit o-US' is connected to control inputs of the adjustable speed ring oscillator s-GPRS. The output o-UM of the metastability circuit UM is also connected to first output o-GL of the random number generator GL. Second output o2-GL of the random number generator GL is connected to the output o-DF of the phase detector DF.

The use of the additional input of the control circuit r-US' allows to add a random stream, produced by the metastability circuit UM, to the circuit based on the oscillators GP and GPRS, the phase detector DF and the control circuit US'.

Random number generator presented in FIG. 6 comprises two adjustable speed ring oscillators GPRS and GPRS', which outputs o-GPRS and o-GPRS' are connected to inputs i1-DF and i2-DF od a phase detector DF and to inputs i1-UM and i2-UM of a metastability circuit UM. An output of the phase detector o-DF is connected to a main input i-US' of a control circuit US', an output of the metastability circuit o-UM is connected to an additional input of the control circuit r-US', and an output of the control circuit o-US' is connected to control inputs of the adjustable speed ring oscillators s-GPRS and s-GPRS'. The output o-UM of the metastability circuit UM is also connected to first output o-GL of the random number generator GL. Second output o2-GL of the random number generator GL is connected to the output o-DF of the phase detector DF.

The use of the second adjustable speed ring oscillator GPRS', operating in the opposite way to the first adjustable speed ring oscillator GPRS, improves generator phase convergence.

Ring oscillator presented in FIG. 7 comprises a delay line LO, which an input i-LO and an output o-LO are connected with each other and connected to an output o-GP of the ring oscillator GP. The delay line LO comprises delays EO connected in series.

The number of delay elements and a corresponding delay caused by each of these elements determines the basic operating frequency of the ring oscillator GP. The base frequency has a random component, resulting from physical phenomena—typical for electronic circuits (noise, thermal phenomena, jitter, etc.).

Adjustable speed ring oscillator presented in FIG. 8 comprises a delay line LO, which an input i-LO and an output o-LO are connected with each other and connected to an output o-GPRS of the adjustable speed ring oscillator GPRS. The delay line LO comprises delays EO connected in series. Between chosen delays EO of the delay line LO an additional delay subcircuit in the form of a capacitor C is connected so, that one of the capacitor's pins is connected to the delay line through a switch KL. The other pin of the capacitor C is connected to the ground of the circuit GND. A control input of the switch KL is connected to a control input of the oscillator s-GPRS.

The oscillator GPRS has two basic operating frequencies and the selection of one of them is made by the oscillator control signal at the control input s-GPRS. The basic operating frequencies depend on the number of delays EO that the delay line LO consists of, on the delay caused by each delay EO, and on the additional delay resulting from connecting the capacitor C causing the slower switching of adjacent delays. The basic frequencies have a random component, resulting from physical phenomena—typical for electronic circuits (noise, thermal phenomena, jitter, etc.).

Adjustable speed ring oscillator presented in FIG. 9 has the same construction as the one presented in FIG. 8, with the difference that the KL' switch has the opposite effect to the KL switch. The opposite switch operation causes that the operating frequency of the GPRS' oscillator is different than the operating frequency of the GPRS oscillator.

Adjustable speed ring oscillator presented in FIG. 10 comprises a delay line LO, which an input i-LO and an output o-LO are connected with each other and connected to an output o-GPRS of the adjustable speed ring oscillator GPRS. The delay line LO comprises delays EO connected in series. Between chosen delays EO of the delay line LO a controlled delay subcircuit T is connected, which a control input s-T is connected to a control input s-GPRS of the adjustable speed ring oscillator GPRS.

The oscillator GPRS has two basic operating frequencies and the selection of one of them is made by the oscillator control signal at the control input s-GPRS. The basic operating frequencies depend on the number of delays EO that the delay line LO consists of, on the delay caused by each delay EO, and one of two additional delays caused by the controlled delay subcircuit T. The additional delay is chosen by the logical control signal at the control input s-GPRS of the adjustable speed ring oscillator GPRS, and thus at the control input s-T of the controlled delay subcircuit T.

The number of delays EO in the delay lines LO of the pair of adjustable speed ring oscillators GPRS determines how frequently the phase correction is made by the phase detector connected to the outputs of these oscillators. Whereas the difference in delays caused by the controlled delay T determines the range of the phase shifts of the pair of oscillators. Moreover, the basic frequencies have a random component, resulting from physical phenomena—typical for electronic circuits (noise, thermal phenomena, jitter, etc.).

Controlled delay subcircuit presented in FIG. 11 comprises two field effect transistors of the opposite channel type P, N. The sources of the transistors are connected together and connected to an input i-T of the controlled delay subcircuit T, the drains of the transistors are connected together and connected to an output o-T of the controlled delay subcircuit T, whereas the gates of the transistors are connected together and connected to a control input s-T of the controlled delay subcircuit T.

The symmetry of the topology of the field effect transistor allows to replace its pins—a drain with a source. The opposite channel type of the field effect transistors controlled by the same logical signal at the transistors' gates, causes that logic zero disables one N-type transistor and turns on the other P-type, whereas the logic '1' does the opposite. The identical geometry of the transistors' channels results in that one of the P-type transistors causes slightly greater delay between an input i-T and an output o-T of the controlled delay subcircuit T. Changing the geometry of the transistor channels, in particular the significant elongation of one of the channels, introduces a highly asymmetric operation of the transistors in terms of their propagation delay. Reversing the length of channels in another pair of transistors, in another controlled delay subcircuit, connected in a series of delays of another adjustable speed ring oscillator, provides complementary control of the pair of such oscillators, in which the same control signal produces the opposite effect in each of them.

Controlled delay subcircuit presented in FIG. 12 has the same construction as the one presented in FIG. 11, with the difference that in series with one of the transistors P, in particular between this transistor and the output o-T of the controlled delay subcircuit T, were connected two delays EO.

The presence of the two additional delays EO causes an additional propagation delay between the input i-T and the output o-T of the controlled delay subcircuit T, for a one particular logic level at s-T input. The same delay elements connected in series with the other transistor of another transistor pair of a controlled delay subcircuit, which was connected in series with delays of another adjustable speed ring oscillator, provide complementary control of the pair of such oscillators, in which the same control signal produces the opposite effect in each of them.

Controlled delay subcircuit in FIG. 13 has the same construction as the one presented in FIG. 11, with the difference that an inverter Inv was connected between the gates of the field effect transistors P and N and the control input s-T of the controlled delay subcircuit T.

The use of the inverter Inv in only one of two controlled delay subcircuits, having identical internal structure, connected in series with delays of delay lines of two different adjustable speed ring oscillators, provides complementary control of the pair of such oscillators in which the same control signal gives the opposite effect in each of them.

Switchable chain ring oscillator presented in FIG. 14 comprises two delay lines LO1 and LO2 as well as a multiplexer MUX. The delay lines LO1 and LO2 are connected in series so, that an output of the first delay line o-LO1 is connected to an input of the second delay line i-LO2. An output of the second delay line o-LO2 is connected to an output o-GPSP of the switchable chain ring oscillator GPSP. Each of the delay lines LO1 and LO2 comprises delays EO connected in series. The multiplexer MUX has two inputs i0-MUX and i1-MUX, which are connected to the outputs of the delay lines o-LO1 and o-LO2. An output of the multiplexer o-MUX is connected to the input of the first delay line i-LO1. A control input of the multiplexer s-MUX is connected to the control input of the oscillator s-GPSP.

The oscillator GPSP has two basic operating frequencies and the selection of one of them is made by the oscillator control signal at the control input s-GPSP. The basic operating frequencies depend on the number of delays EO that each of the delay lines LO1 and LO2 consists of, on the delay caused by each delay EO, and on the delay caused by the multiplexer MUX. The basic frequencies have a random component, resulting from physical phenomena—typical for electronic circuits (noise, thermal phenomena, jitter, etc.).

Switchable chain ring oscillator presented in FIG. 15 has the same construction as the one presented in FIG. 14, with the difference that the inputs i0-MUX and i1-MUX of the multiplexer MUX are connected to do the outputs of the delay lines o-LO1 and o-LO2 in reverse order. The reverse connections of the outputs of the delay lines to the inputs of the multiplexer swap the selected operating frequency of the GPSP' oscillator and the frequency selected in the GPSP oscillator.

Random number generator presented in FIG. 16 comprises two adjustable speed ring oscillators GPRS and GPRS', a phase detector DF, a control circuit US' and seven metastability circuits UM1, UM2, UM3, UM4, UM5, UM6 and UM7. The adjustable speed ring oscillators GPRS and GPRS' comprise delay lines LO and LO' closed in loops so, that an output o-LO and o-LO' of a delay line LO and LO' is connected to an input i-LO and i-LO' of this delay line and also the outputs of the delay lines LO and LO' are connected to outputs o-GPRS and o-GPRS' of the adjustable speed ring oscillators GPRS and GPRS'. The delay lines LO and LO' comprise delays EO connected in series between the inputs i-LO and i-LO' and the outputs o-LO and o-LO' of these delay lines. Between the third and the fourth delay EO, counting from the beginnings of the delay lines LO and LO', the delay lines LO and LO' have connected additional delay subcircuits in the form of a capacitors, which with one of the capacitors' pins are connected to these delay lines through switches K and K', and with the other pins are connected to the ground of the circuit GND. Thus an additional delay subcircuit C is connected to the line. Control inputs of the switches K and K' are connected to control inputs s-GPRS and s-GPRS' of the adjustable speed ring oscillators GPRS and GPRS', whereas the keys K and K' make the opposite effect at the same control signal logical value. The outputs o-GPRS and o-GPRS' of the adjustable speed ring oscillators GPRS and GPRS' are connected to inputs i1-DF and i2-DF of the phase detector DF, having an output o-DF connected to a main input i-US' of the control circuit US', having an output o-US' connected to the control inputs s-GPRS and s-GPRS' of the adjustable speed ring oscillators GPRS and GPRS'. Outputs o-UM1, o-UM2, o-UM3, o-UM4, o-UM5, o-UM6 and o-UM7 of the metastability circuits UM1, UM2, UM3, UM4, UM5, UM6 and UM7 are connected to outputs o1-GL, o2-GL, o3-GL, o4-GL, o5-GL, o6-GL and o7-GL of the random number generator GL, wherein the output o-UM1 of the first metastability circuit UM1 is connected also to an additional input r-US' of the control circuit US'. First input i1-UM1 of the first metastability circuit UM1 is connected to the delay line LO of the first adjustable speed ring oscillator GPRS to an output of the last delay EO counting from the beginning of this delay line. Second input i2-UM1 of the first metastability circuit UM1 is connected to the delay line LO' of the second adjustable speed ring oscillator GPRS' to an output of the last delay EO counting from the beginning of this delay line. First input i1-UM2 of the second metastability circuit UM2 is connected to the delay line LO of the first adjustable speed ring oscillator GPRS to an output of the first delay EO counting from the beginning of this delay line. Second input i2-UM2 of the second metastability circuit UM2 is connected to the delay line LO' of the second adjustable speed ring oscillator GPRS' to an output of the first delay EO counting from the beginning of this delay line. First input i1-UM3 of the third metastability circuit UM3 is connected to the delay line LO of the first adjustable speed ring oscillator GPRS to an output of the second delay EO counting from the beginning of this delay line. Second input i2-UM3 of the third metastability circuit UM3 is connected to the delay line LO' of the second adjustable speed ring oscillator GPRS' to an output of the second delay EO counting from the beginning of this delay line. First input i1-UM4 of the fourth metastability circuit UM4 is connected to the delay line LO of the first adjustable speed ring oscillator GPRS to an output of the fourth delay EO counting from the beginning of this delay line. Second input i2-UM4 of the fourth metastability circuit UM4 is connected to the delay line LO' of the second adjustable speed ring oscillator GPRS' to an output of the fifth delay EO counting from the beginning of this delay line. First input i1-UM5 of the fifth metastability circuit UM5 is connected to the delay line LO of the first adjustable speed ring oscillator GPRS to an output of the fifth delay EO counting from the beginning of this delay line. Second input i2-UM5 of the fifth metastability circuit UM5 is connected to the delay line LO' of the second adjustable speed ring oscillator GPRS' to an output of the seventh delay EO counting from the beginning of this delay line. First input i1-UM6 of the sixth metastability circuit UM6 is connected to the delay line LO of the first adjustable speed ring oscillator GPRS to an output of the eighth delay EO counting from the beginning of this delay line. Second input i2-UM6 of the sixth metastability circuit UM6 is connected to the delay line LO' of the second adjustable speed ring oscillator GPRS' to an output of the eighth delay EO counting from the beginning of this delay line. First input i1-UM7 of the seventh metastability circuit UM7 is connected to the delay line LO of the first adjustable speed ring oscillator GPRS to an output of the eighth delay EO counting from the beginning of this delay line. Second input i2-UM7 of the seventh metastability circuit UM7 is connected to the delay line LO' of the second adjustable speed ring oscillator GPRS' to an output of the eighth delay EO counting from the beginning of this delay line.

The first three of the metastability circuits UM1, UM2 and UM3 are connected to delay lines in the way that assures the delays EO are driven by metastability circuits in the minimal manner and at the same time the metastability circuits are stimulated by similar signals—that is, similar phase shifts of the signals of the adjustable speed ring oscillators GPRS and GPRS'. The third, the fourth and the fifth of the metastability circuits UM3, UM4 and UM5 are also connected to delay lines in the way that assures the delays EO are driven by metastability circuits in the minimal manner, however each of these metastability circuits is stimulated by completely different phase shift of signals of the adjustable speed ring oscillators GPRS and GPRS'. The sixth metastability circuit UM6 is stimulated by the same signals as the seventh metastability circuit UM7. The identical structure of these two metastability circuits UM6 and UM7 provides similar conditions for their stimulation, whereas their different structure—in particular symmetrical with respect to one another, but with asymmetrical operating characteristics—ensures the stimulation of these circuits at different phase shifts.

The adjustable speed ring oscillators GPRS and GPRS' have two basic operating frequencies and the selection of one of them is made by the oscillator control signal at the control inputs s-GPRS and s-GPRS'. The basic operating frequencies depend on the number of delays EO that the delay lines LO and LO' consists of, on the delay caused by each delay EO, and on the additional delays resulting from connecting the capacitor C causing the slower switching of adjacent delays. The basic frequencies have a random component, resulting from physical phenomena—typical for electronic circuits (noise, thermal phenomena, jitter, etc.)—and because of that the signals phase also manifests random changes.

The phase detector DF changes the frequencies of the adjustable speed ring oscillators GPRS and GPRS' by iterative changes or synchronization of the phase of both oscillators. The proximity of the oscillators' phases means time closeness of the edges of generated signals, which are used to stimulate the metastability circuits, which produce random phenomena. The exceptions are the metastability circuits connected to the delay lines with particular shifts, because the goal is to achieve a different phase stimulation shifted by one or multiple propagation times of a delay EO.

Random number generator presented in FIG. 17 comprises two adjustable speed ring oscillators GPRS and GPRS', a phase detector DF, a control circuit US' and seven metastability circuits UM1, UM2, UM3, UM4, UM5, UM6 and UM7. The adjustable speed ring oscillators GPRS and GPRS' comprise delay lines LO and LO' closed in loops so, that an output o-LO and o-LO' of a delay line LO and LO' is connected to an input i-LO and i-LO' of this delay line and also the outputs of the delay lines LO and LO' are connected to outputs o-GPRS and o-GPRS' of the adjustable speed ring oscillators GPRS and GPRS'. The delay lines LO and LO' comprise delays EO connected in series between the inputs i-LO and i-LO' and the outputs o-LO and o-LO' of these delay lines. Between the third and the fourth delay EO, counting from the beginnings of the delay lines LO and LO', the delay lines LO and LO' have connected controlled delay subcircuits T and T', which control inputs s-T and s-T' are connected to control inputs s-GPRS and s-GPRS' of the adjustable speed ring oscillators GPRS and GPRS'. The outputs o-GPRS and o-GPRS' of the adjustable speed ring oscillators GPRS and GPRS' are connected to inputs i1-DF and i2-DF of the phase detector DF, having an output o-DF connected to a main input i-US' of the control circuit US', having an output o-US' connected to the control inputs s-GPRS and s-GPRS' of the adjustable speed ring oscillators GPRS and GPRS'. Outputs o-UM1, o-UM2, o-UM3, o-UM4, o-UM5, o-UM6 and o-UM7 of the metastability circuits UM1, UM2, UM3, UM4, UM5, UM6 and UM7 are connected to outputs o1-GL, o2-GL, o3-GL, o4-GL, o5-GL, o6-GL and o7-GL of the random number generator GL, wherein the output o-UM1 of the first metastability circuit UM1 is connected also to an additional input r-US' of the control circuit US'. First input i1-UM1 of the first metastability circuit UM1 is connected to the delay line LO of the first adjustable speed ring oscillator GPRS to an output of the last delay EO counting from the beginning of this delay line. Second input i2-UM1 of the first metastability circuit UM1 is connected to the delay line LO' of the second adjustable speed ring oscillator GPRS' to an output of the last delay EO counting from the beginning of this delay line. First input i1-UM2 of the second metastability circuit UM2 is connected to the delay line LO of the first adjustable speed ring oscillator GPRS to an output of the first delay EO counting from the beginning of this delay line. Second input i2-UM2 of the second metastability circuit UM2 is connected to the delay line LO' of the second adjustable speed ring oscillator GPRS' to an output of the first delay EO counting from the beginning of this delay line. First input i1-UM3 of the third metastability circuit UM3 is connected to the delay line LO of the first adjustable speed ring oscillator GPRS to an output of the second delay EO counting from the beginning of this delay line. Second input i2-UM3 of the third metastability circuit UM3 is connected to the delay line LO' of the second adjustable speed ring oscillator GPRS' to an output of the second delay EO counting from the beginning of this delay line. First input i1-UM4 of the fourth metastability circuit UM4 is connected to the delay line LO of the first adjustable speed ring oscillator GPRS to an output of the fourth delay EO counting from the beginning of this delay line. Second input i2-UM4 of the fourth metastability circuit UM4 is connected to the delay line LO' of the second adjustable speed ring oscillator GPRS' to an output of the fifth delay EO counting from the beginning of this delay line. First input i1-UM5 of the fifth metastability circuit UM5 is connected to the delay line LO of the first adjustable speed ring oscillator GPRS to an output of the fifth delay EO counting from the beginning of this delay line. Second input i2-UM5 of the fifth metastability circuit UM5 is connected to the delay line LO' of the second adjustable speed ring oscillator GPRS' to an output of the seventh delay EO counting from the beginning of this delay line. First input i1-UM6 of the sixth metastability circuit UM6 is connected to the delay line LO of the first adjustable speed ring oscillator GPRS to an output of the eighth delay EO counting from the beginning of this delay line. Second input i2-UM6 of the sixth metastability circuit UM6 is connected to the delay line LO' of the second adjustable speed ring oscillator GPRS' to an output of the eighth delay EO counting from the beginning of this delay line. First input i1-UM7 of the seventh metastability circuit UM7 is connected to the delay line LO of the first adjustable speed ring oscillator GPRS to an output of the eighth delay EO counting from the beginning of this delay line. Second input i2-UM7 of the seventh metastability circuit UM7 is connected to the delay line LO' of the second adjustable speed ring oscillator GPRS' to an output of the eighth delay EO counting from the beginning of this delay line.

The first three of the metastability circuits UM1, UM2 and UM3 are connected to delay lines in the way that assures the delays EO are driven by metastability circuits in the minimal manner and at the same time the metastability circuits are stimulated by similar signals—that is, similar phase shifts of the signals of the adjustable speed ring oscillators GPRS and GPRS'. The third, the fourth and the fifth of the metastability circuits UM3, UM4 and UM5 are also connected to delay lines in the way that assures the delays EO are driven by metastability circuits in the minimal manner, however each of these metastability circuits is stimulated by completely different phase shift of signals of the adjustable speed ring oscillators GPRS and GPRS'. The sixth metastability circuit UM6 is stimulated by the same signals as the seventh metastability circuit UM7. The identical structure of these two metastability circuits UM6 and UM7 provides similar conditions for their stimulation, whereas their different structure—in particular symmetrical with respect to one another, but with asymmetrical operating characteristics—ensures the stimulation of these circuits at different phase shifts.

The adjustable speed ring oscillators GPRS and GPRS' have two basic operating frequencies and the selection of one of them is made by the oscillator control signals at the control inputs s-GPRS and s-GPRS'. The basic operating frequencies depend on the number of delays EO that the delay lines LO and LO' consists of, on the delay caused by each delay EO, and one of two additional delays caused by the controlled delay subcircuits T and T'. The additional delays are chosen by the logical control signal at the control inputs s-GPRS and s-GPRS' of the adjustable speed ring oscillators GPRS and GPRS', and thus at the control inputs s-T and s-T' of the controlled delay subcircuits T and T'. The basic frequencies have a random component, resulting from physical phenomena—typical for electronic circuits (noise, thermal phenomena, jitter, etc.)—and because of that the signals phase also manifests random changes.

The phase detector DF changes the frequencies of the adjustable speed ring oscillators GPRS and GPRS' by iterative changes or synchronization of the phase of both oscillators. The proximity of the oscillators' phases means time closeness of the edges of generated signals, which are used to stimulate the metastability circuits, which produce random phenomena. The exceptions are the metastability circuits connected to the delay lines with particular shifts, because the goal is to achieve a different phase stimulation shifted by one or multiple propagation times of a delay EO.

Random number generator presented in FIG. 18 comprises two switchable chain ring oscillators GPSP and GPSP', a phase detector DF, a control circuit US' and seven metastability circuits UM1, UM2, UM3, UM4, UM5, UM6 and UM7. Each of the switchable chain ring oscillators GPSP and GPSP' comprises two delay lines LO1 and LO2 as well as LO1' and LO2' closed in loops so, that an output o-LO1 and o-LO1' of the first delay line LO1 and LO1' is connected to an input i-LO2 and i-LO2' of the second delay line, and an output o-LO2 and o-LO2' of the second delay line LO2 and LO2' is connected to an input i-LO1 and i-LO1' of the first delay line and also to an output o-GPSP and o-GPSP' of the switchable chain ring oscillator GPSP and GPSP'. The delay lines LO1, LO2, LO1' and LO2' comprise delays EO connected in series between the inputs i-LO1, i-LO2, i-LO1' and i-LO2' and the outputs o-LO1, o-LO2, o-LO1' and o-LO2' of these delay lines. The switchable chain ring oscillators GPSP and GPSP' comprise multiplexers MUX and MUX', which inputs i0-MUX and i1-MUX as well as i0-MUX' and i1-MUX' are connected to the outputs of both delay lines o-LO1 and o-LO2 as well as o-LO2' and o-LO1', in reverse order between multiplexers. Outputs of the multiplexers o-MUX and o-MUX' are connected to the inputs of the first delay lines i-LO1 and i-LO1'. Control inputs of the multiplexers s-MUX and s-MUX' are connected to control inputs s-GPSP and s-GPSP' of the switchable chain ring oscillators GPSP and GPSP'. The outputs o-GPSP and o-GPSP' of the switchable chain ring oscillators GPSP and GPSP' are connected to inputs i1-DF and i2-DF of the phase detector DF, having an output o-DF connected to a main input i-US' of the control circuit US', having an output o-US' connected to the control inputs s-GPSP and s-GPSP' of the switchable chain ring oscillators GPSP and GPSP'. Outputs o-UM1, o-UM2, o-UM3, o-UM4, o-UM5, o-UM6 and o-UM7 of the metastability circuits UM1, UM2, UM3, UM4, UM5, UM6 and UM7 are connected to outputs o1-GL, o2-GL, o3-GL, o4-GL, o5-GL, o6-GL and o7-GL of the random number generator GL, wherein the output o-UM1 of the first metastability circuit UM1 is connected also to an additional input r-US' of the control circuit US'. First input i1-UM1 of the first metastability circuit UM1 is connected to the second delay line LO2 of the first switchable chain ring oscillator GPSP to an output of the last delay EO counting from the beginning of this delay line. Second input i2-UM1 of the first metastability circuit UM1 is connected to the second delay line LO2' of the second switchable chain ring oscillator GPSP' to an output of the last delay EO counting from the beginning of this delay line. First input i1-UM2 of the second metastability circuit UM2 is connected to the first delay line LO1 of the first switchable chain ring oscillator GPSP to an output of the first delay EO counting from the beginning of this delay line. Second input i2-UM2 of the second metastability circuit UM2 is connected to the first delay line LO1' of the second switchable chain ring oscillator GPSP' to an output of the first delay EO counting from the beginning of this delay line. First input i1-UM3 of the third metastability circuit UM3 is connected to the first delay line LO1 of the first switchable chain ring oscillator GPSP to an output of the second delay EO counting from the beginning of this delay line. Second input i2-UM3 of the third metastability circuit UM3 is connected to the first delay line LO1' of the second switchable chain ring oscillator GPSP' to an output of the second delay EO counting from the beginning of this delay line. First input i1-UM4 of the fourth metastability circuit UM4 is connected to the first delay line LO1 of the first switchable chain ring oscillator GPSP to an output of the fourth delay EO counting from the beginning of this delay line. Second input i2-UM4 of the fourth metastability circuit UM4 is connected to the first delay line LO1' of the second switchable chain ring oscillator GPSP' to an output of the fifth delay EO counting from the beginning of this delay line. First input i1-UM5 of the fifth metastability circuit UM5 is connected to the first delay line LO1 of the first switchable chain ring oscillator GPSP to an output of the fifth delay EO counting from the beginning of this delay line. Second input i2-UM5 of the fifth metastability circuit UM5 is connected to the second delay line LO2' of the second switchable chain ring oscillator GPSP' to an output of the second delay EO counting from the beginning of this delay line. First input i1-UM6 of the sixth metastability circuit UM6 is connected to the second delay line LO2 of the first switchable chain ring oscillator GPSP to an output of the third delay EO counting from the beginning of this delay line. Second input i2-UM6 of the sixth metastability circuit UM6 is connected to the second delay line LO2' of the second switchable chain ring oscillator GPSP' to an output of the third delay EO counting from the beginning of this delay line. First input i1-UM7 of the seventh metastability circuit UM7 is connected to the second delay line LO2 of the first switchable chain ring oscillator GPSP to an output of the third delay EO counting from the beginning of this delay line. Second input i2-UM7 of the seventh metastability circuit UM7 is connected to the second delay line LO2' of the second switchable chain ring oscillator GPSP' to an output of the third delay EO counting from the beginning of this delay line.

The first three of the metastability circuits UM1, UM2 and UM3 are connected to delay lines in the way that assures the delays EO are driven by metastability circuits in the minimal manner and at the same time the metastability circuits are stimulated by similar signals—that is, similar phase shifts of the signals of the switchable chain ring oscillators GPSP and GPSP'. The third, the fourth and the fifth of the metastability circuits UM3, UM4 and UM5 are also connected to delay lines in the way that assures the delays EO are driven by metastability circuits in the minimal manner, however each of these metastability circuits is stimulated by completely different phase shift of signals of the switchable chain ring oscillators GPSP and GPSP'. The sixth metastability circuit UM6 is stimulated by the same signals as the seventh metastability circuit UM7. The identical structure of these two metastability circuits UM6 and UM7 provides similar conditions for their stimulation, whereas their different structure—in particular symmetrical with respect to one another, but with asymmetrical operating characteristics—ensures the stimulation of these circuits at different phase shifts.

The switchable chain ring oscillators GPSP and GPSP' have two basic operating frequencies and the selection of one of them is made by the oscillator control signal at the control inputs s-GPSP and s-GPSP'. The basic operating frequencies depend on the number of delays EO that each of the delay lines LO1 and LO2 and LO1' and LO2' consists of, on the delay caused by each delay EO, and on the delays caused by the multiplexers MUX and MUX'. The basic frequencies have a random component, resulting from physical phenomena—typical for electronic circuits (noise, thermal phenomena, jitter, etc.)—and because of that the signals phase also manifests random changes.

The phase detector DF changes the frequencies of the switchable chain ring oscillators GPSP and GPSP' by iterative changes or synchronization of the phase of both oscillators. The proximity of the oscillators' phases means time closeness of the edges of generated signals, which are used to stimulate the metastability circuits, which produce random phenomena. The exceptions are the metastability circuits connected to the delay lines with particular shifts, because the goal is to achieve a different phase stimulation shifted by one or multiple propagation times of a delay EO.

Control circuit presented in FIG. 19 comprises a two-element series consisting of delays EO connected between an input i-US and an output o-US of a control system US.

The chain of EO delays causes a delay in the circuit's feedback, i.e., a delay in transmitting the phase correction signal, thus it improves the chaotic properties of the system.

Control circuit presented in FIG. 20 comprises a randomness adder XOR', which first input is an input of random data r-US' of the control circuit US', a second input of the randomness adder is a signal input of the control circuit i-US', and an output of the randomness adder is an output of the control circuit o-US'.

The randomness adder XOR' causes a delay between the input i-US' and the output o-US' for the feedback signal and it adds to this signal a random value supplied to the input of random data of the control circuit r-US'.

Control circuit presented in FIG. 21 has the same construction as the one presented in FIG. 20, in which the first input of the randomness adder XOR' is connected to the input of random data of the control circuit r-US' through a strobing circuit AND', and a strobe control LCZ' is connected to the strobing circuit AND'.

The strobing circuit AND' along with the strobe control LCZ' allow only selected random values delivered to the input of random data of the control circuit r-US'. For example, the strobe control LCZ' can be made as a counter, which will only permit one in several random values.

Control circuit presented in FIG. 22 has the same construction as the one presented in FIG. 21, in which the output of the randomness adder XOR' is connected to the output of the control circuit o-US' through a two-element series of delays EO.

The series of delays EO along with the randomness adder XOR' cause a delay between the input i-US' and the output o-US' of the control circuit. This delay affects the characteristics of the phase correction in the circuit. The connection of the randomness adder XOR' in regard to the delays EO in the series of elements between the signal input i-US' and the output of the control circuit o-US', affects the moment of injecting the randomness into the phase correction circuit.

Control circuit presented in FIG. 23 is a combination of the control circuits presented in FIG. 21 and FIG. 22, with the exception of the placement of the randomness adder XOR' in regard to delays EO—the randomness adder was placed between the delays.

Phase detector presented in FIG. 24 consists of a flip-flop P having two inputs D and C being the inputs i1-DF and i2-DF of the phase detector DF, and an output Q being the output of the phase detector o-DF.

Depending on whether the rising edge on the D input of the flip-flop occurs before or after the rising edge on the C input of the flip-flop, the logic '1' or logic '0' will appear on the output Q. The type of the flip-flop—e.g., D flip-flop, RS flip-flop, JK flip-flop etc.—is of secondary importance, as long as the flip-flop detects which of the input signals slopes came first.

Phase detector presented in FIG. 25 comprises a logic circuit AND having two inputs and one output as well as two flip-flops P1 and P2, having two inputs D1, C1 and D2, C2 each as well as two outputs Q1, nQ1 and Q2, nQ2 each. The inputs of the flip-flops are connected to inputs of the phase detector DF, whereas the outputs of the flip-flops are connected to outputs of the phase detector through the logic circuit AND. The first input of the phase detector i1-DF is connected to both the first input of the first flip-flop D1 and the second input of the second flip-flop C2. The second input of the phase detector i2-DF is connected to both the second input of the first flip-flop C1 and the first input of the second flip-flop D2. The inputs of the logic circuit AND are connected to the second output of the first flip-flop nQ1 and the first output of the second flip-flop Q2. The output of the logic circuit AND is connected to the output of the phase detector o-DF.

The phase detector composed of two flip-flops provides symmetrical detection of negative and positive phase shifts.

Metastability circuit presented in FIG. 26 consists of a flip-flop Pa having two inputs Da and Ca being the inputs i1-UM and i2-UM of the metastability circuit UM, and an output Qa being the output of the metastability circuit o-UM.

The flip-flop Pa is characterized by the fact that the proximity of the edges of signals on the inputs of the flip-flop Da and Ca causes a metastable range of operation resulting in a random logic state on the output Qa. The type of the flip-flop—e.g., D flip-flop, RS flip-flop, JK flip-flop etc.—is of secondary importance, as long as the flip-flop provides a random response at the output in case of appropriate proximity of the edges of the input signals.

Metastability circuit presented in FIG. 27 comprise a metastable circuit with an oscillatory response UMOO having two inputs R and S being the inputs i1-UM and i2-UM of the metastability circuit UM, and an output wOO being the output of the metastability circuit o-UM.

The flip-flop UMOO is characterized by the fact that the proximity of the edges of signals on the inputs of the flip-flop R and S causes a metastable range of operation resulting in oscillatory response of the flip-flop with a variable number of oscillations as well as in a random response at the output wOO.

Metastability circuit presented in FIG. 28 has the same construction as the one presented in FIG. 27, wherein the output wOO of the metastable circuit with an oscillatory response UMOO is connected to the output of the metastability circuit o-UM through an adder SUM.

The adder SUM is used for adding up a variable number of oscillations at the output wOO.

Metastability circuit presented in FIG. 29 has the same construction as the one presented in FIG. 28, wherein it additionally comprises a counter LCZ, having outputs connected to consecutive inputs of the adder SUM and having an input i-LCZ connected to the output of the metastable circuit with an oscillatory response wOO.

The counter LCZ is used for counting a variable number of oscillations at the output wOO, which then adds the adder SUM. Moreover, the logical state at the output wOO is also taken into account in this circuit.

Metastability circuit presented in FIG. 30 comprises a metastable generator of time intervals GMIC, an arbiter circuit ARB and a logic circuit AND. The metastable generator of time intervals GMIC comprises two flip-flops Pb and Pc, having two inputs Db and Cb as well as Dc and Cc each, and having single outputs Qb and Qc each. The arbiter circuit ARB comprises two flip-flops Pd and Pe, having two inputs Dd and Cd as well as De and Ce each, and having two outputs Qd and nQd as well as Qe and nQe each. The logic circuit AND has two inputs and one output. The inputs of the flip-flops of the metastable generator of time intervals GMIC are connected to the inputs of the metastability circuit UM so, that the first input of the metastability circuit i1-UM is connected to both the first input of the first flip-flop Db and the first input of the second flip-flop Dc, whereas the second input of the metastability circuit i2-UM is connected to both the second input of the first flip-flop Cb and the second input of the second flip-flop Cc. The outputs of the flip-flops Qb and Qc are connected to the inputs of the flip-flops of the arbiter circuit ARB so, that the output of the first flip-flop Qb is connected to both the first input of the first flip-flop of the arbiter circuit Dd and the second input of the second flip-flop of the arbiter circuit Ce, whereas the output of the second flip-flop Qc is connected to both the second input of the first flip-flop of the arbiter circuit Cd and the first input of the second flip-flop of the arbiter circuit De. The output of the metastability circuit o-UM is connected to the outputs of the flip-flops of the arbiter circuit nQd and Qe through the logic circuit AND. The inputs of the logic circuit AND are connected to the second output of the first flip-flop of the arbiter circuit nQd and the first output of the second flip-flop of the arbiter circuit Qe. The output of the logic circuit AND is connected to the output of the metastability circuit o-UM.

Providing to the flip-flops Pb and Pc of the metastable generator of time intervals GMIC digital signals with relatively close proximity of the edges of the signals at the inputs of the flip-flops, causes metastable states in them, which result in logical values at the outputs Qb and Qc in various moments. Both the logical values and the time intervals are sources of randomness with specific properties of these randomities. The arbiter circuit compares the response times of the flip-flops Pb and Pc, and the result of this comparison—which is a random value—is interpreted by the logic circuit AND as logical zero or logical one.

The invention can be applied and used in generating truly random numbers and series.

The unique added value resulting from the application of the invention is that it can be implemented in purely digital programmable circuit. Due to the fact that the variable in the feedback of the digital circuit is not only logical value but also time, the circuit exhibits properties specific to analog chaotic circuits. As a result, the deterministic digital circuit yields truly chaotic analog and continuous variables, which contradicts the general knowledge of experts.

The invention claimed is:

1. A random number generator comprising a bistable, having inputs and an output connected to an output of the random number generator, and comprising at least two ring oscillators, being respectively connected to the inputs of the bistable, wherein at least one of the ring oscillators is an adjustable speed ring oscillator, and the output of the bistable, having the inputs connected to the ring oscillators, is connected to at least one control inputs of the adjustable speed ring oscillator, wherein the bistable is a phase detector,
wherein the phase detector comprises two flip-flops, each having two inputs and two outputs,
wherein the inputs of the flip-flops are connected to inputs of the phase detector, and outputs of the flip-flops are connected to outputs of the phase detector, and
wherein the first input of the phase detector is connected to both the first input of the first flip-flop and the second input of the second flip-flop, the second input of the phase detector is connected to both the second input of the first flip-flop and the first input of the second flip-flop, and the output of the phase detector is connected to chosen outputs of the flip-flops through a logic circuit.

2. The random number generator according to claim 1, further comprising at least a second bistable, having a first input connected to one of the ring oscillators and a second input connected to another of the ring oscillators.

3. The random number generator according to claim 2, further comprising at least a third ring oscillator, wherein at least the second bistable has at least one of the inputs connected to at least the third ring oscillator.

4. The random number generator according to claim 1, wherein at least one output of the bistable is connected to at least one control input of the adjustable speed ring oscillators through a control circuit.

5. The random number generator according to claim 1, wherein at least one output of the bistable is connected to at least one control input of the adjustable speed ring oscillators through a control circuit, and an output of another bistable is connected to a second input of the control circuit.

6. The random number generator according to claim 1, further comprising at least one additional bistable, wherein at least one of the at least one additional bistable is a metastability circuit.

7. The random number generator according to claim 1, wherein at least one of the ring oscillators comprises at least one delay line, having an input and an output connected together and connected to the output of the ring oscillator, wherein the delay line comprises delays connected in series.

8. The random number generator according to claim 1, wherein at least one of the adjustable speed ring oscillator comprises at least one delay line, having an input and an output connected together and connected to the output of the adjustable speed ring oscillator, wherein the delay line comprises delays connected in series.

9. The random number generator according to claim 1, wherein at least one adjustable speed ring oscillator is a switchable chain ring oscillator.

10. The random number generator according to claim 9, wherein at least one switchable chain ring oscillator comprises at least two delay lines connected with each other so that an output of the first delay line is connected to an input of the second delay line, and an output of one of the delay lines is connected to the output of the switchable chain ring oscillator, wherein the at least two delay lines comprise delays connected in series, wherein at least one switchable chain ring oscillator comprises a multiplexer having a control input connected to the control input of the switchable chain ring oscillator, and an output of the multiplexer is connected to the input of one of the delay lines, and inputs of the multiplexer are respectively connected to an input and an output of the other delay line.

11. The random number generator according to claim 1, further comprising at least two metastability circuits connected to delay lines so, that the inputs of the metastability circuits are separated in the delay lines with at least one delay.

12. The random number generator according to claim 11, wherein at least one of the metastability circuits is connected with the first input to a first series of delays of the delay lines of one ring oscillator, after a delay having the first number in the first series counting from a delay connected with its input to the output of the ring oscillator, and the second input of the metastability circuit is connected to a second series of delays of the delay lines of another ring oscillator, after a delay having the second number in the second series counting from a delay having an input connected to the output of the another ring oscillator, wherein the first number is different from the second number.

13. The random number generator according to claim 11, wherein the at least two metastability circuits are connected with at least one input each in the same place of at least one delay line.

14. The random number generator according to claim 4, wherein the at least one control circuit comprises at least one delay.

15. The random number generator according to claim 1, wherein the phase detector consists of a flip-flop with two inputs being the inputs of the phase detector and an output being the output of the phase detector.

16. The random number generator according to claim 6, wherein the metastability circuit consists of a flip-flop with two inputs being the inputs of the metastability circuit and an output being the output of the metastability circuit.

17. A random number generator comprising a bistable, having inputs and an output connected to an output of the random number generator, and comprising at least two ring oscillators, being respectively connected to the inputs of the bistable, wherein at least one of the ring oscillators is an adjustable speed ring oscillator, and the output of the bistable, having the inputs connected to the ring oscillators, is connected to at least one control inputs of the adjustable speed ring oscillator,
wherein the bistable is a metastability circuit,
wherein the metastability circuit comprises a metastable circuit with an oscillatory response with two inputs being the inputs of the metastability circuit and an output being the output of the metastability circuit, and the output of the metastable circuit with an oscillatory response is connected to the output of the metastability circuit through an adder (SUM), and
wherein the metastability circuit further comprises a counter, having outputs connected to consecutive inputs of the adder, and having an input connected to the output of the metastable circuit with an oscillatory response.

18. A random number generator, comprising a bistable, having inputs and an output connected to an output of the random number generator, and comprising at least two ring oscillators, being respectively connected to the inputs of the bistable, wherein at least one of the ring oscillators is an adjustable speed ring oscillator, and the output of the bistable, having the inputs connected to the ring oscillators, is connected to at least one control inputs of the adjustable speed ring oscillator,
wherein the bistable is a metastability circuit,
wherein the metastability circuit comprises a metastable generator of time intervals, having inputs connected to the inputs of the metastability circuit and outputs connected to inputs of an arbiter circuit, having outputs connected to the outputs of the metastability circuit through a logic circuit.

* * * * *